US011830454B2

(12) United States Patent
Hara et al.

(10) Patent No.: US 11,830,454 B2
(45) Date of Patent: Nov. 28, 2023

(54) ACTIVE MATRIX SUBSTRATE AND DISPLAY DEVICE

(71) Applicant: Sharp Display Technology Corporation, Kameyama (JP)

(72) Inventors: Kengo Hara, Kameyama (JP); Tohru Daitoh, Kameyama (JP); Yoshihito Hara, Kameyama (JP); Jun Nishimura, Kameyama (JP); Yohei Takeuchi, Kameyama (JP)

(73) Assignee: SHARP DISPLAY TECHNOLOGY CORPORATION, Kameyama (JP)

( * ) Notice: Subject to any disclaimer, the term of this patent is extended or adjusted under 35 U.S.C. 154(b) by 0 days.

(21) Appl. No.: 18/101,270

(22) Filed: Jan. 25, 2023

(65) Prior Publication Data

US 2023/0252951 A1 Aug. 10, 2023

Related U.S. Application Data

(60) Provisional application No. 63/307,303, filed on Feb. 7, 2022.

(51) Int. Cl.
*G09G 3/36* (2006.01)
*H01L 27/12* (2006.01)

(52) U.S. Cl.
CPC ......... *G09G 3/3677* (2013.01); *H01L 27/124* (2013.01); *H01L 27/1225* (2013.01);
(Continued)

(58) Field of Classification Search
CPC ......... G09G 3/3677; G09G 2310/0286; G09G 2330/021; H01L 27/1225; H01L 27/124
See application file for complete search history.

(56) References Cited

U.S. PATENT DOCUMENTS

| 2010/0032668 A1 | 2/2010 | Yamazaki et al. |
| 2012/0138922 A1 | 6/2012 | Yamazaki et al. |

(Continued)

FOREIGN PATENT DOCUMENTS

| JP | 2012-134475 A | 7/2012 |
| JP | 2014-007399 A | 1/2014 |

(Continued)

*Primary Examiner* — Abhishek Sarma
(74) *Attorney, Agent, or Firm* — KEATING & BENNETT, LLP

(57) ABSTRACT

An active matrix substrate includes a gate driver including a shift register including a plurality of unit circuits connected in multiple stages. Each of the plurality of unit circuits includes an output node, a first node, a first TFT including a first gate terminal supplied with the set signal, a first source terminal connected to the first node, and a first drain terminal supplied with a first power supply potential higher than a low-level potential of the set signal, and a second TFT including a second gate terminal connected to the first node, a second source terminal connected to the output node, and a second drain terminal supplied with the clock signal. The first TFT includes a semiconductor layer, and a first and a second gate electrodes disposed on a side of the semiconductor layer opposite to the substrate and connected to the first gate terminal. The semiconductor layer includes a source contact region electrically connected to the first source terminal, a drain contact region electrically connected to the first drain terminal, and a first and a second channel regions separated from each other in a channel length direction between the contact regions when viewed from a normal direction of the substrate. The first gate electrode overlaps the first channel region via an upper gate insulating layer, and the second gate electrode overlaps the second channel region via the upper gate insulating layer.

18 Claims, 29 Drawing Sheets

(52) U.S. Cl.
CPC ............... *G09G 2310/0286* (2013.01); *G09G 2330/021* (2013.01)

(56) References Cited

U.S. PATENT DOCUMENTS

| | | |
|---|---|---|
| 2013/0320334 A1 | 12/2013 | Yamazaki et al. |
| 2014/0286076 A1 | 9/2014 | Aoki et al. |
| 2019/0067218 A1* | 2/2019 | Lin .................... H01L 27/0292 |
| 2019/0114984 A1 | 4/2019 | Tanaka et al. |
| 2019/0147821 A1 | 5/2019 | Tagawa et al. |
| 2019/0147822 A1 | 5/2019 | Takeuchi et al. |
| 2020/0135132 A1 | 4/2020 | Tanaka et al. |
| 2022/0352382 A1* | 11/2022 | Wang .................... G11C 19/28 |
| 2023/0092089 A1* | 3/2023 | Zhang ............... G02F 1/133388 |
| | | 257/91 |

FOREIGN PATENT DOCUMENTS

| | | |
|---|---|---|
| JP | 2014-209727 A | 11/2014 |
| JP | 2019-074560 A | 5/2019 |
| JP | 2019-090927 A | 6/2019 |
| JP | 2019-091516 A | 6/2019 |
| JP | 6882405 B2 | 6/2021 |

* cited by examiner

ACTIVE MATRIX SUBSTRATE AND DISPLAY DEVICE

CROSS-REFERENCE TO RELATED APPLICATIONS

This application claims the benefit of priority to U.S. Provisional Application No. 63/307,303 filed on Feb. 7, 2022. The entire contents of the above-identified application are hereby incorporated by reference.

BACKGROUND

Technical Field

The disclosure relates to an active matrix substrate and a display device.

An active matrix substrate used in a liquid crystal display device, an organic electroluminescence (EL) display device, or the like includes a display region including a plurality of pixels disposed in a matrix shape, and a region other than the display region (a non-display region or a frame region). Each of the plurality of pixels includes a Thin Film Transistor (hereinafter referred to as a "TFT") and a pixel electrode. The TFT associated with each pixel is referred to as a "pixel TFT". The active matrix substrate also includes a plurality of gate bus lines and a plurality of source bus lines, and a gate electrode and a source electrode of the pixel TFT are electrically connected to a corresponding one of the plurality of gate bus lines and a corresponding one of the plurality of source bus lines, respectively. A drain electrode of the pixel TFT is connected to the pixel electrode of the pixel.

As the pixel TFT, in the related art, a TFT including an amorphous silicon film as an active layer (hereinafter referred to as an "amorphous silicon TFT") and a TFT including a crystalline silicon film, such as a polycrystalline silicon film, as an active layer (hereinafter referred to as a "crystalline silicon TFT") have been widely used. Further, there is proposed use of an oxide semiconductor as a material of the active layer of the TFT, in place of amorphous silicon and crystalline silicon. Such a TFT is referred to as an "oxide semiconductor TFT". The oxide semiconductor has a higher mobility than amorphous silicon. Thus, the oxide semiconductor TFT can operate at a higher speed than the amorphous silicon TFT.

In a non-display region of the active matrix substrate, a gate drive circuit (gate driver) for driving the plurality of gate bus lines is formed monolithically (integrally) in some cases. The gate driver includes a shift register including a plurality of unit circuits connected in multiple stages, for example. The shift register outputs a pulse signal (scanning signal) for selecting a gate bus line by sequentially shifting a shift signal input to a unit circuit of a particular stage to the next stage in synchronization with a clock signal. FIG. 17 illustrates a configuration of a unit circuit SRref of a reference example.

In a display device including the active matrix substrate, line-sequential scanning is performed. In a line-sequential scanning system, a data signal (also referred to as a display signal) supplied to the pixel electrode is a signal supplied to a source bus line connected to a pixel TFT when the pixel TFT selected by a scanning signal supplied from the gate driver to the gate bus line is turned on. Accordingly, the pixel TFTs connected to a particular gate bus line are simultaneously turned on, and at that time, corresponding data signals are supplied from the source bus lines connected to the respective pixel TFTs of the pixel region in that row. This operation is performed sequentially from, for example, a pixel row located on the uppermost side of a display surface to a pixel row located on the lowermost side to write and display one image (frame) in the display region. Note that, a time between one pixel row being selected and the next pixel row being selected is called a horizontal scan period, (1H), and that a time between a particular row being selected and then the row being selected a second time is called a vertical scanning period, (1V), or a frame.

In recent years, display devices (hereinafter referred to a "touch panel") provided with touch sensors have been widely used in smartphones, tablet portable terminals, and the like. Various types of touch sensors are known, such as a resistive film type, an electrostatic capacitive type, an optical type, and the like. The electrostatic capacitive touch sensor electrically detects a change in an electrostatic capacitance due to contact or approximation of an object (for example, a finger) to determine whether the display device is in a touched state. Thus a position (touch position) being touched by or in proximity to an object can be detected.

For example, in an in-cell touch panel type display device with a built-in electrostatic capacitance type touch sensor (hereinafter simply referred to as an "in-cell touch panel"), a display mode and a touch detection mode for detecting a touch position may be performed in a time-division manner by using a common electrode provided to face the pixel electrode as an electrode for touch detection. In this case, as illustrated in FIG. 18, display periods (write periods) DPs for displaying images and pause periods SPs for pausing scanning to detect the touch position are provided during one frame (one vertical scanning period). During the pause period SP, a clock operation of a clock signal GCK stops.

For example, when the unit circuit SRref of the reference example illustrate in FIG. 17 is used for the gate driver of the in-cell touch panel that operates as illustrated in FIG. 18, a potential of a first node netA connected to a gate of an output transistor M2 may decrease during the pause period SP for pausing the scanning, and thus a malfunction may occur. A circuit configuration for suppressing this is proposed, for example, in JP 2019-90927 A and JP 2019-091516 A.

SUMMARY

The present inventors have found, as a result of investigation, that when the unit circuit is configured so as to be able to suppress a decrease in the potential of the first node netA in the pause period SP, power consumption of the gate driver may increase. Details will be described below.

An embodiment of the disclosure has been conceived in light of the above-described circumstance, and an object of the disclosure is to provide an active matrix substrate including a gate driver capable of suppressing an increase in the power consumption while suppressing the malfunction caused by the pause period for pausing the scanning.

The present specification discloses an active matrix substrate and a display device described in the following Items.

Item 1

An active matrix substrate including,
a substrate;
a plurality of source bus lines and a plurality of gate bus lines supported by the substrate; and
a gate driver configured to selectively drive the plurality of gate bus lines, wherein the gate driver includes a shift register including a plurality of unit circuits provided corresponding to the plurality of gate bus lines and connected in multiple stages, each of the plurality of unit circuits receives at least a clock signal and a set signal, the set signal being a start pulse signal or a signal output from a unit circuit of a stage before each of the plurality of unit circuits, each of the plurality of unit circuits includes an output node connected to one of the plurality of gate bus lines, a first node, a first TFT including a first gate terminal supplied with the set signal, a first source terminal connected to the first node, and a first drain terminal supplied with a first power supply potential higher than a low-level potential of the set signal, and a second TFT including a second gate terminal connected to the first node, a second source terminal connected to the output node, and a second drain terminal supplied with the clock signal, the first TFT includes a semiconductor layer, and a first gate electrode and a second gate electrode disposed on a side of the semiconductor layer opposite to the substrate and connected to the first gate terminal, the semiconductor layer includes a source contact region electrically connected to the first source terminal, a drain contact region electrically connected to the first drain terminal, and a first channel region and a second channel region separated from each other in a channel length direction between the source contact region and the drain contact region when viewed from a normal direction of the substrate, and the first gate electrode overlaps the first channel region via an upper gate insulating layer, and the second gate electrode overlaps the second channel region via the upper gate insulating layer.

Item 2

The active matrix substrate according to Item 1, wherein the semiconductor layer further includes an intervening region located between the first channel region and the second channel region when viewed from the normal direction of the substrate, and the intervening region is located between the first gate electrode and the second gate electrode when viewed from the normal direction of the substrate.

Item 3

The active matrix substrate according to Item 2, wherein the first TFT further includes a lower conductive layer located on the substrate side of the semiconductor layer and at least partially overlapping the first channel region and/or the second channel region of the semiconductor layer via a lower insulating layer.

Item 4

The active matrix substrate according to Item 3, wherein the lower conductive layer overlaps the entirety of a first region including the first channel region, the second channel region, and the intervening region of the semiconductor layer when viewed from the normal direction of the substrate.

Item 5

The active matrix substrate according to Item 3, wherein the lower conductive layer includes a first lower conductive layer at least partially overlapping the first channel region and a second lower conductive layer at least partially overlapping the second channel region when viewed from the normal direction of the substrate, and at least a part of the intervening region is located between the first lower conductive layer and the second lower conductive layer when viewed from the normal direction of the substrate.

Item 6

The active matrix substrate according to any one of Items 2 to 5, wherein the intervening region is a low-resistive region having a lower specific resistance than the first channel region and the second channel region.

Item 7

The active matrix substrate according to any one of Items 1 to 6, further including a wiring line disposed on a side of the semiconductor layer opposite to the substrate, wherein the wiring line includes two portions extending across the semiconductor layer in a channel width direction when viewed from the normal direction of the substrate, each of the two portions functioning as respective one of the first gate electrode and the second gate electrode.

Item 8

The active matrix substrate according to any one of Items 1 to 7, wherein the semiconductor layer includes a high-mobility semiconductor having a mobility of 20 $cm^2/Vs$ or greater.

Item 9

The active matrix substrate according to any one of Items 1 to 8, wherein the second TFT includes a second semiconductor layer including a single channel region and a single gate electrode disposed on a side of the second semiconductor layer opposite to the substrate.

Item 10

The active matrix substrate according to any one of Items 1 to 9, wherein the clock signal is configured to intermittently perform a clock operation, in which a potential periodically changes between a low-level potential and a high-level potential, with a clock stop period, in which the clock operation is stopped, interposed in the clock operation.

Item 11

The active matrix substrate according to Item 10, wherein a negative bias is applied to the first gate electrode and the second gate electrode of the first TFT in the clock stop period.

Item 12

The active matrix substrate according to Item 10 or 11, wherein each of the plurality of unit circuits further receives a control signal and a reset signal, the control signal being a signal turned to a low-level potential in a period other than the clock stop period and turned to a high-level potential in the clock stop period, and the reset signal being a clear signal or a signal output from a unit circuit of a stage subsequent to each of the plurality of unit circuits, and each of the plurality of unit circuits further includes a third TFT including a third gate terminal supplied with the reset signal, a third source terminal supplied with the control signal, and a third drain terminal connected to the first node.

Item 13

The active matrix substrate according to any one of Items 1 to 12, wherein each of the plurality of unit circuits further includes a capacitance portion including a first electrode connected to the output node and a second electrode connected to the first node.

Item 14
The active matrix substrate according to any one of Items 1 to 13, further including a controller configured to supply a plurality of signals including the clock signal and the start pulse signal to the shift register.

Item 15
The active matrix substrate according to any one of Items 1 to 14, wherein the first TFT is an oxide semiconductor TFT including an oxide semiconductor layer as an active layer.

Item 16
The active matrix substrate according to Item 15, wherein the oxide semiconductor layer includes an In—Ga—Zn—O based semiconductor.

Item 17
The active matrix substrate according to Item 16, wherein the In—Ga—Zn—O based semiconductor includes a crystalline portion.

Item 18
A display device including:
the active matrix substrate according to Item 10;
a counter substrate facing the active matrix substrate;
a liquid crystal layer provided between the active matrix substrate and the counter substrate; and
a touch sensor,
wherein the display device is configured to detect a touch position by the touch sensor during the clock stop period.

According to an embodiment of the disclosure, an active matrix substrate including a gate driver capable of suppressing an increase in power consumption while suppressing a malfunction caused by a pause period for pausing the scanning can be provided.

BRIEF DESCRIPTION OF DRAWINGS

The disclosure will be described with reference to the accompanying drawings, wherein like numbers reference like elements.

DESCRIPTION OF EMBODIMENTS

Overall Configuration of Active Matrix Substrate

First, a basic configuration of the active matrix substrate will be described by taking an active matrix substrate used in a liquid crystal display device including a touch sensor as an example.

Figure 1A:
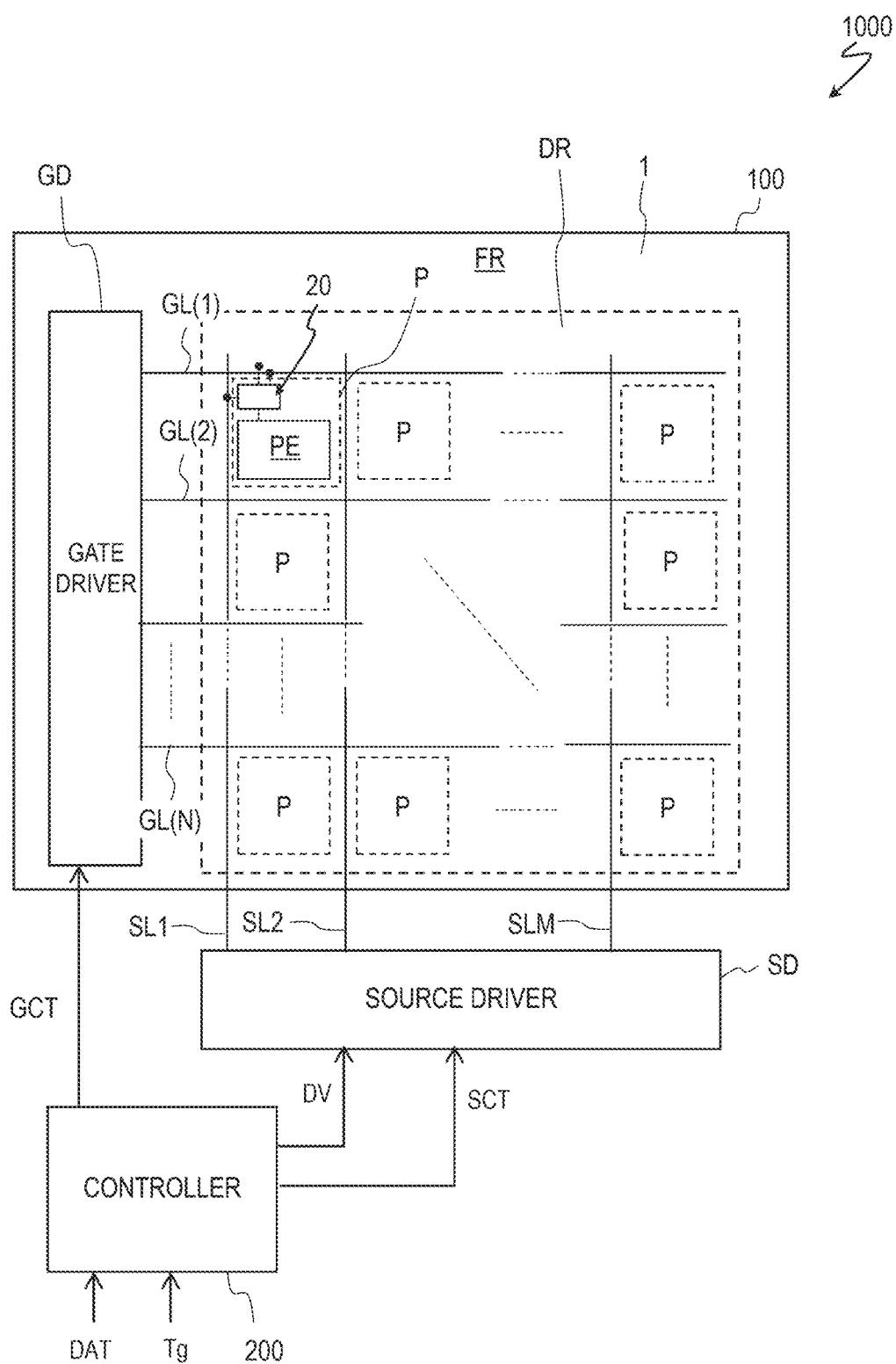
FIG. 1A is a block diagram illustrating an overall configuration of a liquid crystal display device 1000 including a touch sensor.

FIG. 1A is a block diagram illustrating an overall configuration of a liquid crystal display device 1000 including a touch sensor.

The liquid crystal display device 1000 includes an active matrix substrate 100, a counter substrate (not illustrated), and a liquid crystal layer (not illustrated). The active matrix substrate 100 and the counter substrate face each other with the liquid crystal layer interposed therebetween to form a liquid crystal panel.

The active matrix substrate 100 includes a display region DR including a plurality of pixel regions P and a non-display region (also referred to as "frame region") FR located around the display region DR. The display region DR is defined by the plurality of pixel regions P. The plurality of pixel regions P are arrayed in a matrix shape including a plurality of rows (here, N rows) and a plurality of columns (here, M columns). Each pixel region P is a region corresponding to a pixel of the liquid crystal display device, and the pixel region P may be called simply the "pixel". The non-display region FR is a region positioned in a periphery of the display region DR and does not contribute to display.

Provided in the display region DR are a plurality of (M) source bus lines SL1 to SLM extending in a column direction and a plurality of (N) gate bus lines GL(1) to GL(N) extending in a row direction. In the present specification, the source bus lines SL1 to SLM and the gate bus lines GL(1) to GL(N) may be collectively referred to as a "source bus line SL" and a "gate bus line GL", respectively. Each pixel region P is a region surrounded by a pair of the gate bus lines GL adjacent to each other and a pair of the source bus lines SL adjacent to each other, for example. In the present example, the display region DR includes M×N pixel regions P.

In the display region DR, a thin film transistor (pixel TFT) 20 provided corresponding to each pixel region P and a pixel electrode PE electrically connected to the pixel TFT 20 are disposed. The pixel TFT 20 is supplied with a gate signal (scanning signal) from a corresponding gate bus line GL, and is supplied with a data signal (display signal) from a corresponding source bus line SL. As the pixel TFT 20, an oxide semiconductor TFT including an oxide semiconductor layer as an active layer may be used, or other TFTs such as an amorphous silicon TFT or a crystalline silicon TFT may be used.

When a display mode of the liquid crystal display device 1000 is a traverse electrical field mode such as an FFS mode or an In-Plane Switching (IPS) mode, an electrode (common electrode) (not illustrated) common to the plurality of pixel regions P is provided on the active matrix substrate 100. When the display mode is a vertical electrical field mode such as a Twisted Nematic (TN) mode or a Vertical Alignment (VA) mode, the common electrode is provided on the counter substrate side.

Figure 1B:
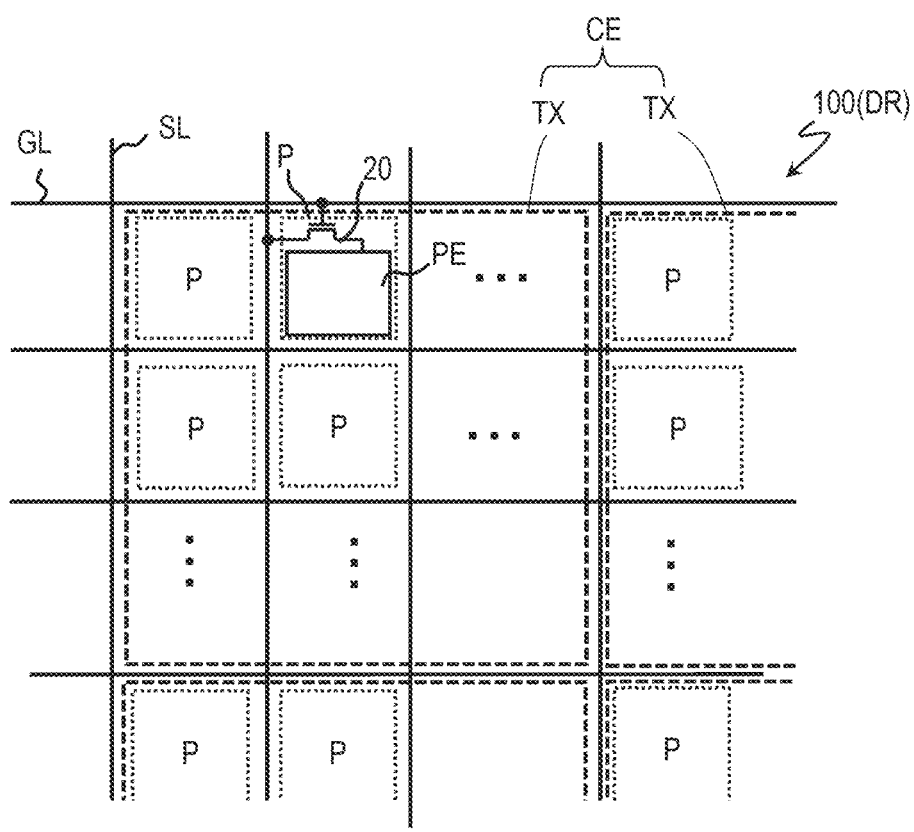
FIG. 1B is an enlarged plan view illustrating a part of a display region of the liquid crystal display device 1000.

In the present example, as illustrated in FIG. 1B, a common electrode CE is divided into a plurality of segments TX. Each segment TX functions as a touch sensor electrode. Each touch sensor electrode TX may be provided to correspond to a plurality of pixel regions P. Although not illustrated, each touch sensor electrode TX is connected, through a touch wiring line, to a touch drive unit provided in the non-display region FR.

A peripheral circuit is provided in the non-display region FR. In the present example, a gate driver GD for selectively driving the gate bus line GL is integrally (monolithically) formed as the peripheral circuit.

A source driver SD for driving the source bus line SL and a controller 200 are also implemented in the non-display region FR. The controller 200 performs image display control for displaying an image and performs touch position detection control for detecting the touch position. Here, the controller 200 is configured to switch in a time division manner between a display mode for the plurality of touch sensor electrodes TX to function as the common electrode CE and a touch detection mode for the plurality of touch sensor electrodes TX to function as the touch sensor electrodes TX. For example, the controller 200 applies a common signal to the touch sensor electrode TX (common electrode CE) via the touch wiring line in the display mode, and applies a touch drive signal to the touch sensor electrode TX via the touch wiring line in the touch detection mode.

The controller 200 receives an image signal DAT and a timing control signal Tg supplied from the outside, and outputs a digital video signal DV, a data side control signal SCT for controlling an operation of the source driver SD, and a scanning side control signal GCT for controlling the gate driver GD.

The source driver SD applies data signals to the source bus lines SL1 to SLM, based on the digital video signal DV and the data side control signal SCT from the controller 200.

The gate driver GD applies scanning signals to the gate bus lines GL(1) to GL(N), based on the scanning side control signal GCT from the controller 200. In this manner, the active scanning signals are sequentially applied to the gate bus lines GL(1) to GL(N) in each frame period.

Basic Configuration of Gate Driver

Figure 2:
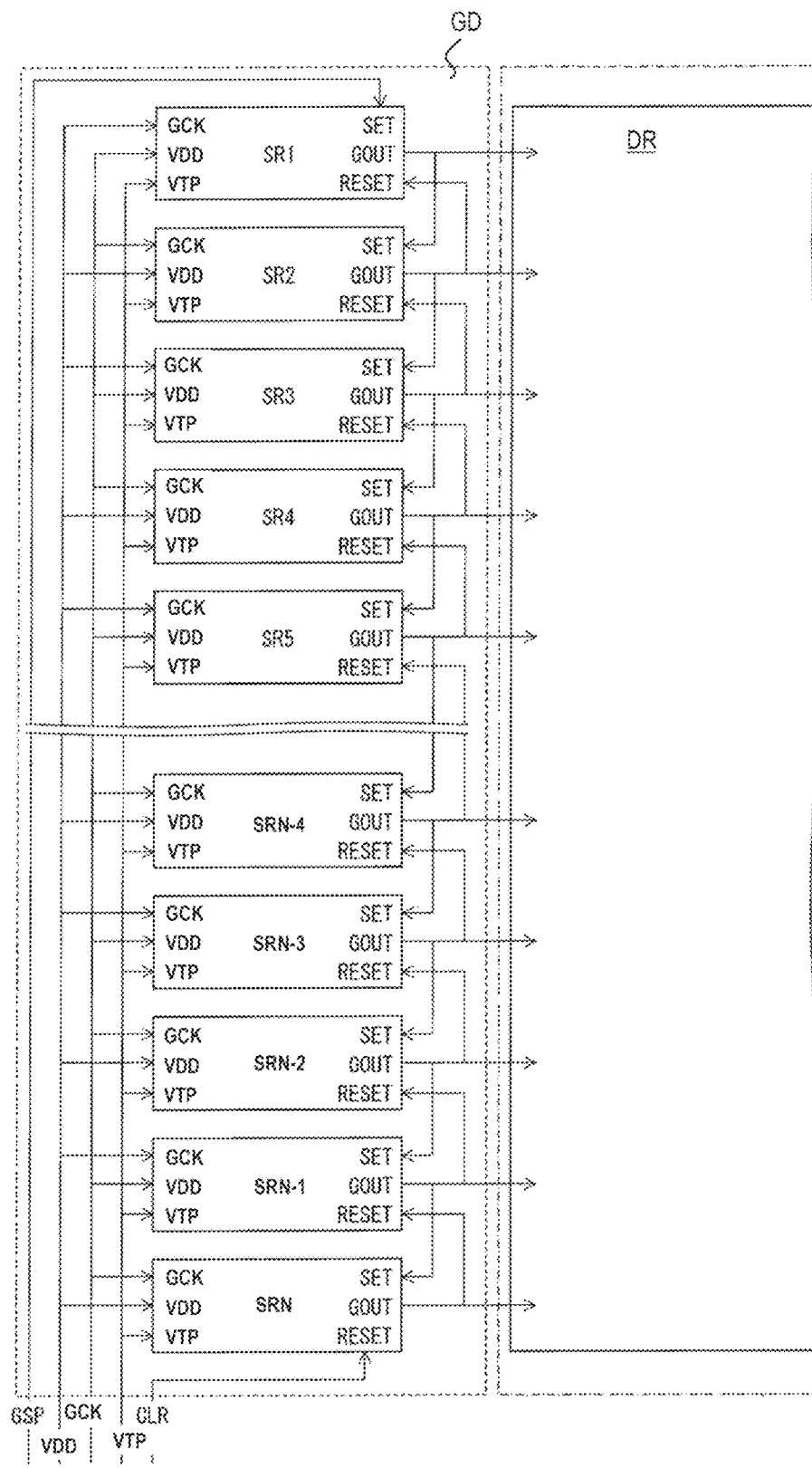
FIG. 2 is a schematic diagram illustrating an example of a gate driver GD.

FIG. 2 is a schematic diagram illustrating an example of the gate driver GD. The gate driver GD includes a shift register. The shift register includes a plurality of (here, N) unit circuits SR1 to SRN (may be collectively referred to as a "unit circuit SR") connected in multiple stages.

The shift register is supplied with a gate start pulse signal GSP, a clock signal GCK, a high-level power supply voltage signal VDD, a control signal VTP, a clear signal CLR, and the like as the scanning side control signal GCT (FIG. 1). The clock signal GCK is a signal that performs a clock operation periodically changing between the low-level potential and the high-level potential. The clock signal GCK may be a clock signal of a plurality of phases (for example, two phases) different from each other. The control signal VTP is a signal that is turned to the high-level potential in the pause period SP.

The unit circuit SR in each stage includes a set terminal that receives a set signal SET, a reset terminal that receives a reset signal RESET, an output terminal that outputs an output signal (scanning signal) GOUT, a VDD terminal supplied with the high-level power supply voltage signal VDD, a VTP terminal that receives the control signal VTP, and a clock input terminal that receives the clock signal GCK. An output signal of a unit circuit of a stage before (in the present example, unit circuit of one stage before) the unit circuit SR is input to the set terminal, as the set signal SET. The gate start pulse signal GSP is input to the set terminal of the unit circuit SR1 of the first stage. The unit circuit SR of each stage also outputs the output signal GOUT to a corresponding gate bus line GL arranged in the display region. An output signal of a unit circuit of a stage subsequent to (in the present example, a unit circuit of next stage of) the unit circuit SR is input to the reset terminal, as the reset signal RESET. A clear signal CLR is input to a reset terminal of the unit circuit SRN in the final stage.

Unit Circuit SR

Figure 3:
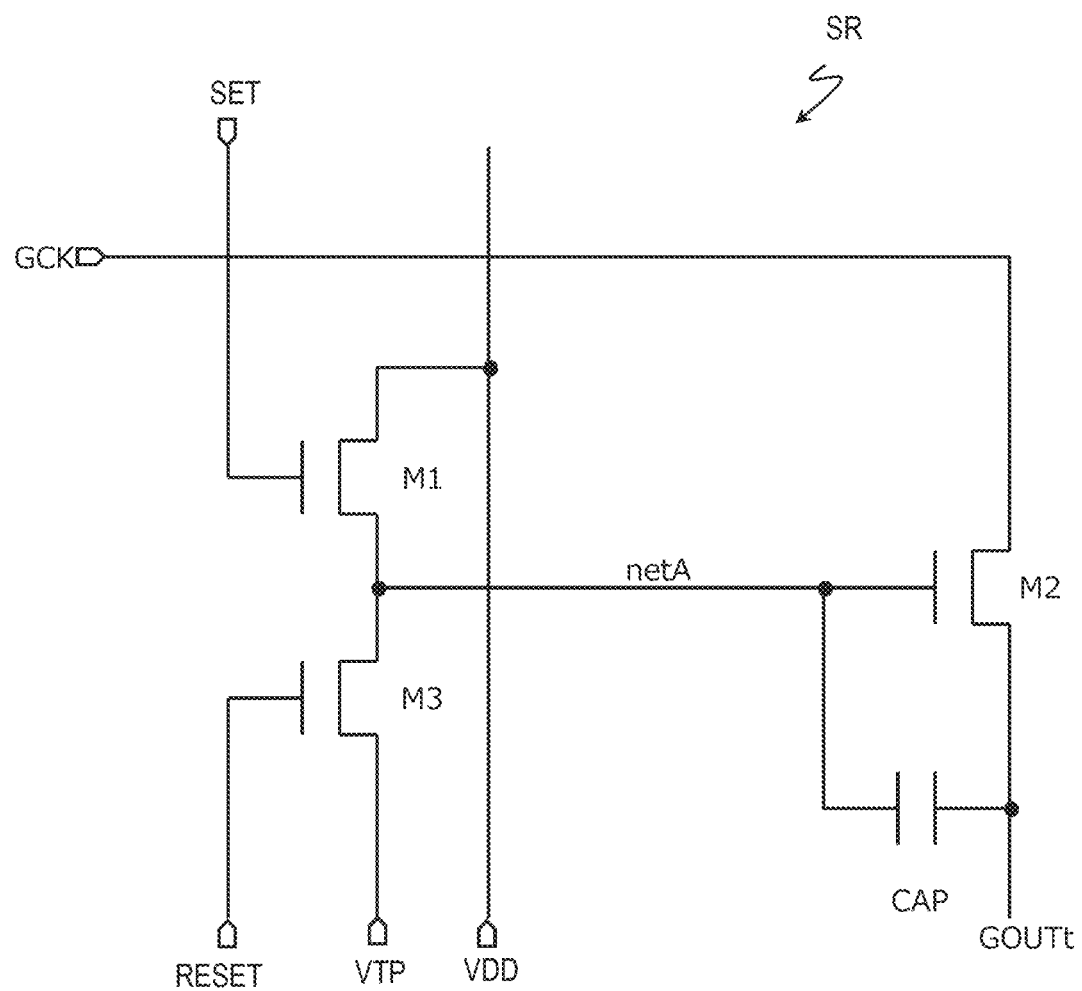
FIG. 3 is a circuit diagram illustrating one unit circuit SR included in a gate driver.

FIG. 3 is a circuit diagram illustrating one unit circuit SR included in the gate driver according to the present embodiment.

The unit circuit SR includes, for example, three transistors M1, M2, and M3, and a capacitance portion CAP. The transistors M1 to M3 are, for example, n-channel type TFTs. In the present specification, a node connected to a gate of the transistor M2 serving as an output transistor is referred to as a "first node netA", and a node including an output terminal connected to one of the plurality of gate bus lines is referred to as an "output node". As described below, a connection destination of a drain terminal of the transistor M1 differs from that in the unit circuit SRref of the reference example illustrated in FIG. 17.

The transistors M1 is the set transistor. A gate terminal of the transistor M1 is connected to the set terminal. The gate terminal is supplied with the set signal SET. A source terminal of the transistor M1 is connected to the first node netA (that is the gate of the transistor M2). The drain terminal of the transistor M1 is connected to the VDD terminal and is supplied with the high-level power supply voltage signal VDD. A potential of the high-level power supply voltage signal VDD is higher than low-level potentials of the set signal SET and the clock signal GCK, for example. In the present example, the high-level power supply voltage signal VDD has the same potential as the high-level potential of the control signal VTP.

The transistor M2 is the output transistor. The transistor M2 serves as a transmission gate to pass therethrough or block the clock signal GCK. A gate terminal of the transistor M2 is connected to the first node netA. A source terminal of the transistor M2 is connected to an output terminal (output node). A drain terminal of the transistor M2 is connected to a clock input terminal to which the clock signal GCK is input, and is supplied with the clock signal GCK.

The capacitance portion CAP is connected between the gate terminal and the source terminal of the transistor M2. One of the electrodes of the capacitance portion CAP is connected to the first node netA, and the other electrode is connected to the output node including the output terminal.

The transistor M3 serves as a pull-down transistor to reduce a potential at the first node netA. The transistor M3 is disposed between the VTP terminal to which the control signal VTP is input and the first node netA. A gate terminal of the transistor M3 is connected to the reset terminal and is supplied with the reset signal RESET. A source terminal of the transistor M3 is connected to the VTP terminal and is supplied with the control signal VTP. A drain terminal of the transistor M3 is connected to the first node netA.

Operation of Gate Driver

Next, operations of the gate driver including the unit circuit SR will be described.

Figure 4A:
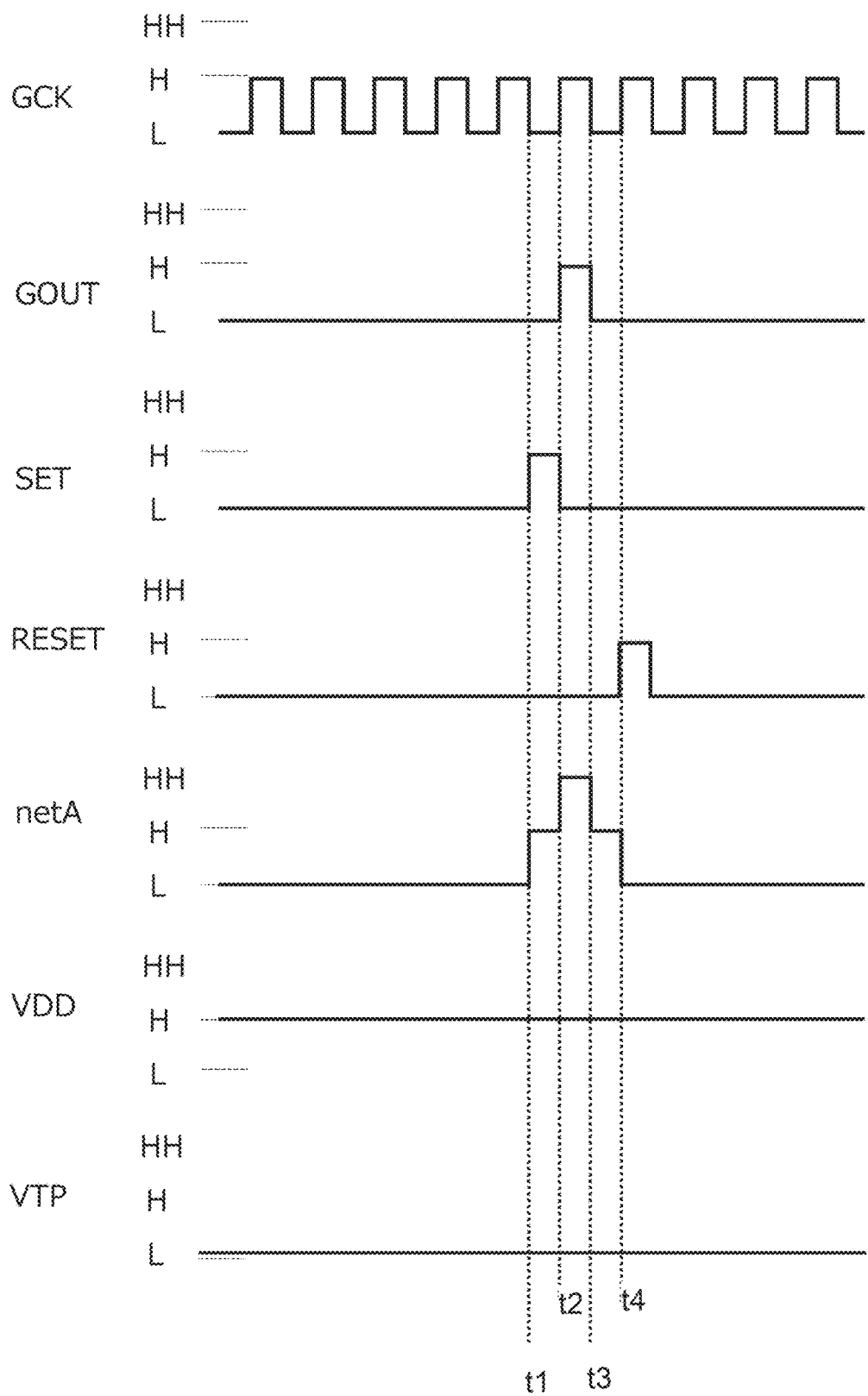
FIG. 4A is a signal waveform diagram for describing operations of the unit circuit SR in a case where a touch position is not detected.

FIG. 4A is a signal waveform diagram (timing chart) for describing operations of the unit circuit SR in a case where a touch position is not detected. In the present specification, for each signal, the low-level potential, the high-level potential, and a higher potential higher than an H level may be abbreviated as "L level", "H level", and "HH level", respectively. In the present example, for the signals GCK, GOUT, SET, and RESET, and the first node netA, the "L level" has the same potential as a low-level power supply voltage signal VSS, and the "H level" has the same potential as the high-level power supply voltage signal VDD. The clock signal GCK is configured so that the potential periodically changes between the L level and the H level.

When the set signal SET changes from the L level to the H level at a point of time t1, the set transistor M1 is turned to the on state, and the capacitance portion CAP is charged. Consequently, the potential of the first node netA changes from the L level to the H level, and the output transistor M2 is turned to the on state. However, at the point of time t1, the clock signal GCK is at the L level, and thus, the output signal GOUT is maintained at the L level.

At a point of time t2, the clock signal GCK changes from the L level to the H level. Since the output transistor M2 is in the on state, the potential of the output node rises along with the rise of the potential of the clock input terminal. Since the capacitance portion CAP is provided between the first node netA and the output node as described above, the potential of the first node netA also rises along with the rise of the potential of the output node (the first node netA is brought to be bootstrapped). As a result, a large voltage is applied to the gate terminal of the output transistor M2, and a potential of the output signal GOUT rises to a level sufficient for the gate bus line GL connected to the output node to be in the selected state.

At a point of time t3, the clock signal GCK changes from the H level to the L level. As a result, the potential of the output node (the potential of the output signal GOUT) decreases along with the decrease of the potential of the clock input terminal. As the potential of the output node decreases, the potential of the first node netA also decreases via the capacitance portion CAP.

At a point of time t4, the reset signal RESET changes from the L level to the H level. Accordingly, the pull-down transistor M3 is turned to the on state, and the first node netA is connected to the VTP terminal. The control signal VTP is at the L level (here, the same potential as the low-level power supply voltage signal VSS) other than the pause period SP, and thus the potential of the first node netA decreases to the L level, and the output transistor M2 is turned to the off state.

Note that, in the present specification, a period (from the point of time t1 to the point of time t2) in which the first node netA is charged from the L level to the H level by the set signal SET turning to the H level is referred to as a "charging period", a period (from the point of time t2 to the point of time t3) in which the potential of the first node netA is turned to the HH level higher than the H level by the bootstrap effect of the capacitance portion CAP is referred to as a "boost period", a period (from the point of time t3 to the point of time t4) in which the first node netA is maintained at the H level after the boost period is referred to as a "pre-reset period", and a period in which the first node netA is maintained at the L level after the reset is referred to as a "non-select period".

Such operations are performed in each unit circuit SR, thus the plurality of gate bus lines GL(1) to GL(N) provided in the liquid crystal display device are sequentially turned to be in the selected state, and the writing to the pixel capacitor is sequentially performed.

Figure 4B:
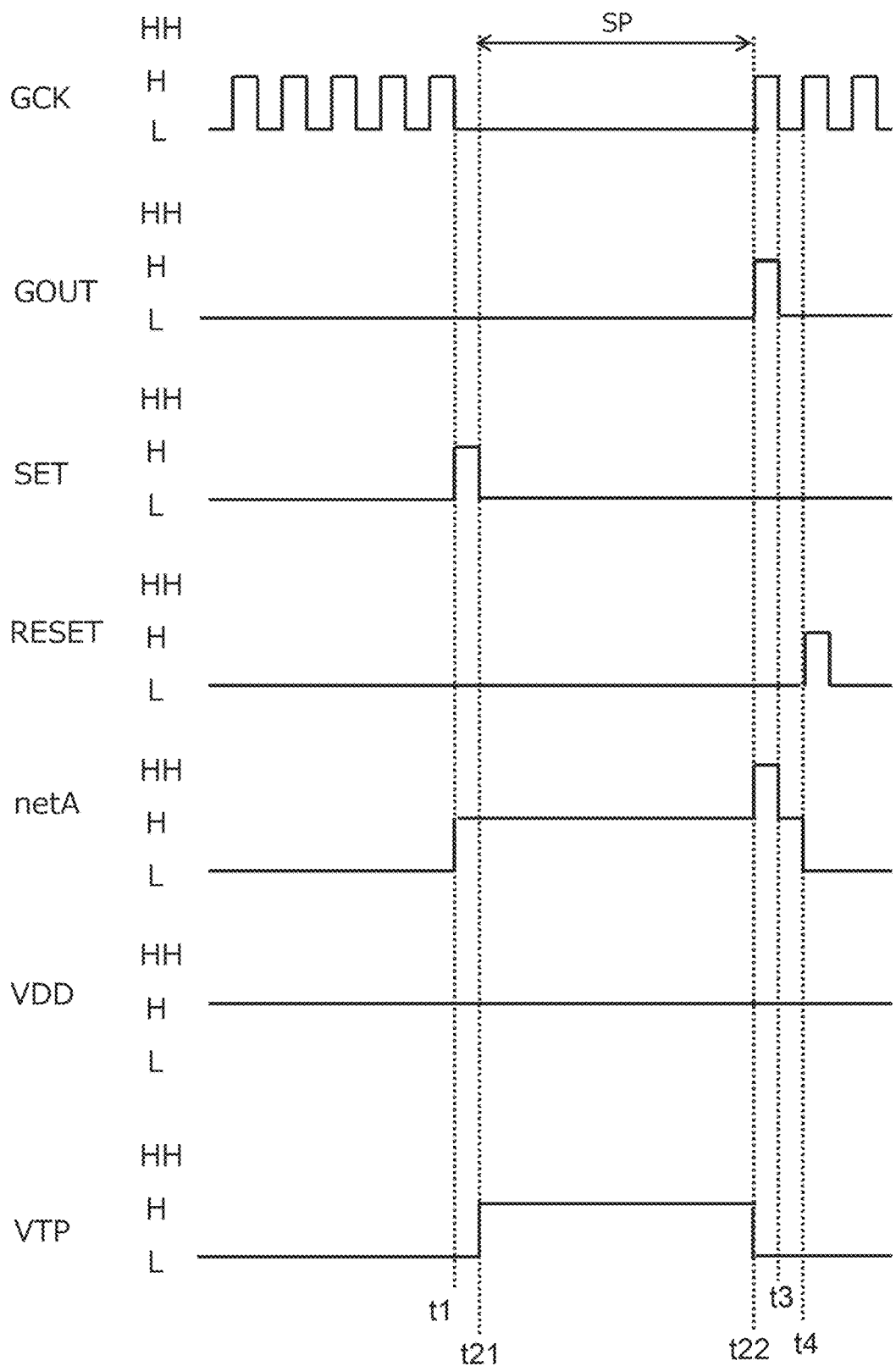
FIG. 4B is a signal waveform diagram for describing an example of operations of the unit circuit SR in a case where the touch position is detected.

FIG. 4B is a signal waveform diagram for describing an example of operations of the unit circuit SR in a case where the touch position is detected. In the present example, a period from a point of time t21 to a point of time t22 is the pause period SP for pausing the scanning. Detection of the touch position is performed within the pause period SP.

In the pause period SP, the clock signal GCK stops the clock operation in which the potential periodically changes between the L level and the H level. That is, the clock signal GCK is configured to intermittently perform the clock operation with the pause period SP (period in which the clock operation is stopped) interposed in the clock operation. The control signal VTP is a signal that is at the H level during the pause period SP (in other words, the period in which the clock signal GCK stops the clock operation) and is at the L level during a period other than the pause period SP.

From the point of time t1 to the point of time t21 is the charging period in which the first node netA is charged from the L level to the H level, as in FIG. 4A.

At the point of time t21, the scanning is interrupted (the pause period SP starts). Even at the point of time t21, the clock signal GCK is maintained at the L level, and the first node netA is maintained at the H level. At the point of time t21, the control signal VTP changes from the L level to the H level. The control signal VTP is supplied in common to all of the unit circuits SR. Accordingly, the transistor M3 in every unit circuit SR is turned to the on state, and the potential of the output signal GOUT from every unit circuit SR (in other words, the potential of every scanning signal) is pulled to the L level.

At a point of time t22, the pause period SP ends, and the control signal VTP changes from the H level to the L level. This turns the transistor M3 to the off state. At the point of time t22, the clock signal GCK changes from the L level to the H level, and the clock operation is resumed.

Thereafter, as in FIG. 4A, from the point of time t22 to the point of time t3, the potential of the first node netA is turned to the HH level by the bootstrap effect (boost period), and from the point of time t3 to the point of time t4, the first node netA is maintained at the H level (pre-reset period).

As described below, in the present embodiment, since the drain terminal of the transistor M1 is connected to the VDD terminal, a decrease in the potential of the first node netA is suppressed, and the potential of the first node netA is maintained at a sufficiently high level in the pause period SP from the point of time t21 to the point of time t22. In this way, at the point of time t22, the same operation as the point of time t2 (see FIG. 4B) described above is performed, and the potential of the output signal GOUT rises to a level sufficient for the gate bus line GL to be in the selected state.

Effect due to Configuration of Unit Circuit SR

Figure 17:
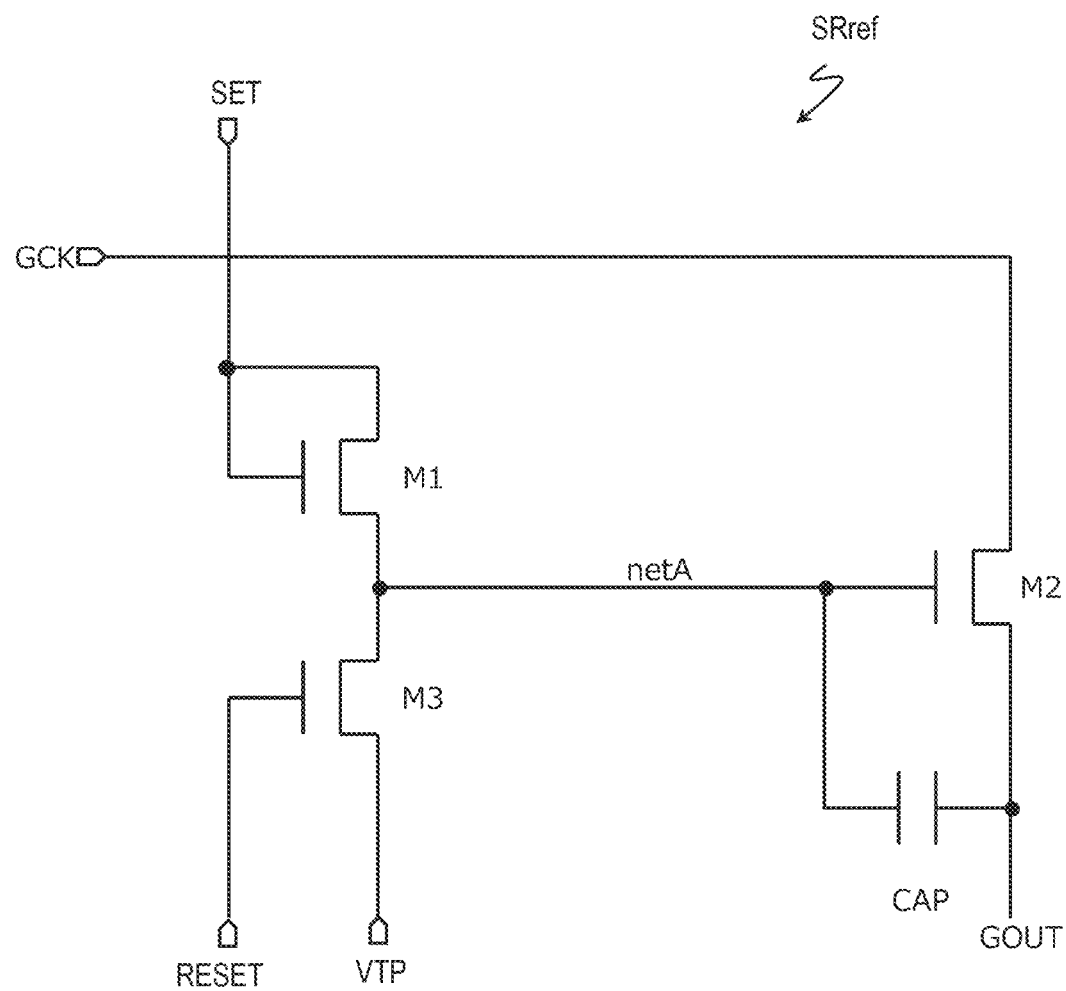
FIG. 17 is a circuit diagram illustrating the unit circuit SRref of the reference example including a diode connection type set transistor.
Figure 18:
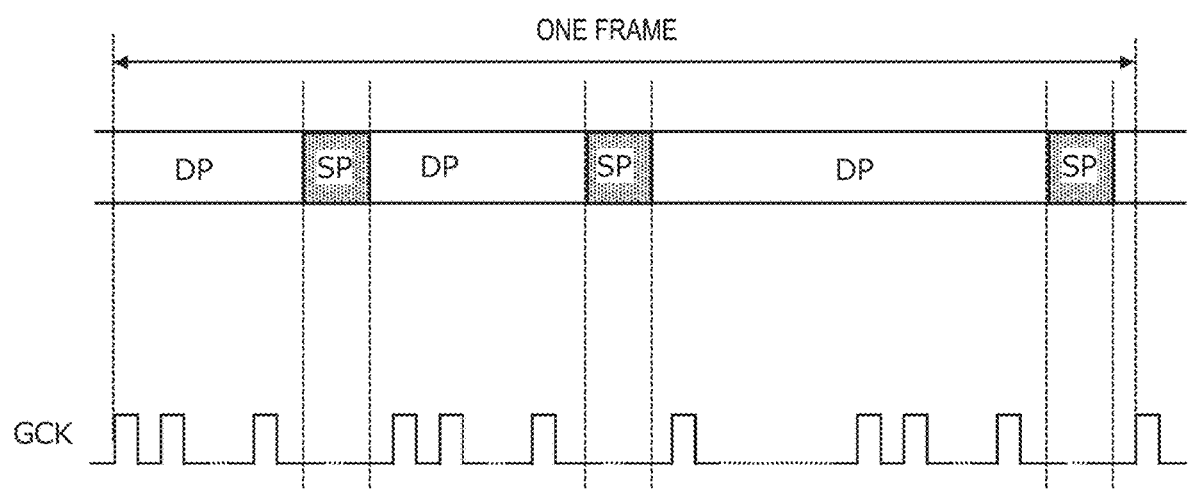
FIG. 18 is a diagram for describing the write period DP in an in-cell touch panel and the pause period SP for pausing the scanning.

In the unit circuit SRref of the reference example illustrated in FIG. 17, both the gate terminal and the drain terminal of the set transistor are connected to the set terminal. Hereinafter, such connection of the set transistor is referred to as "diode connection", and a diode connected set transistor is referred to as "diode connection type set transistor".

In contrast, in the present embodiment, as illustrated in FIG. 3, the drain side of the transistor M1 serving as the set transistor is connected to the VDD terminal. Such connection of the set transistor is referred to as "VDD connection", and a VDD connected set transistor is referred to as "VDD connection type set transistor". According to the present embodiment, it is possible to maintain the potential of the first node netA at a high level through the pause period SP in the unit circuit SR in the stop stage by the VDD connection of the set transistor. Accordingly, the scanning may be resumed after the end of the pause period SP. The reasons for this will be described.

Figure 5A:
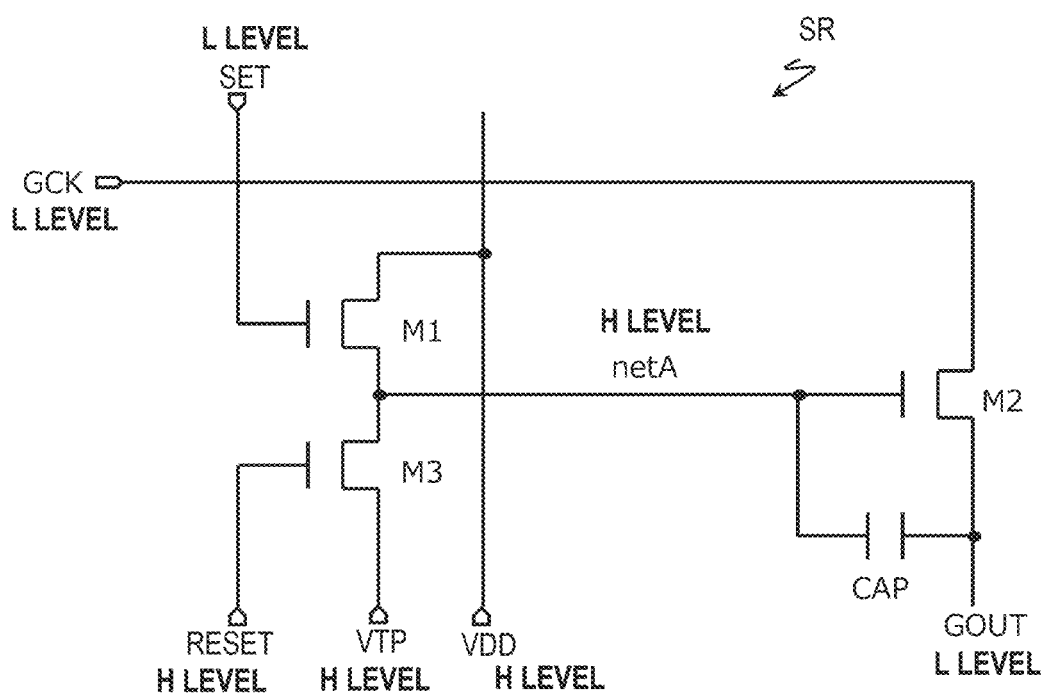
FIG. 5A is a diagram illustrating a potential level of each terminal in a pause period of the unit circuit SR according to the present embodiment.
Figure 5B:
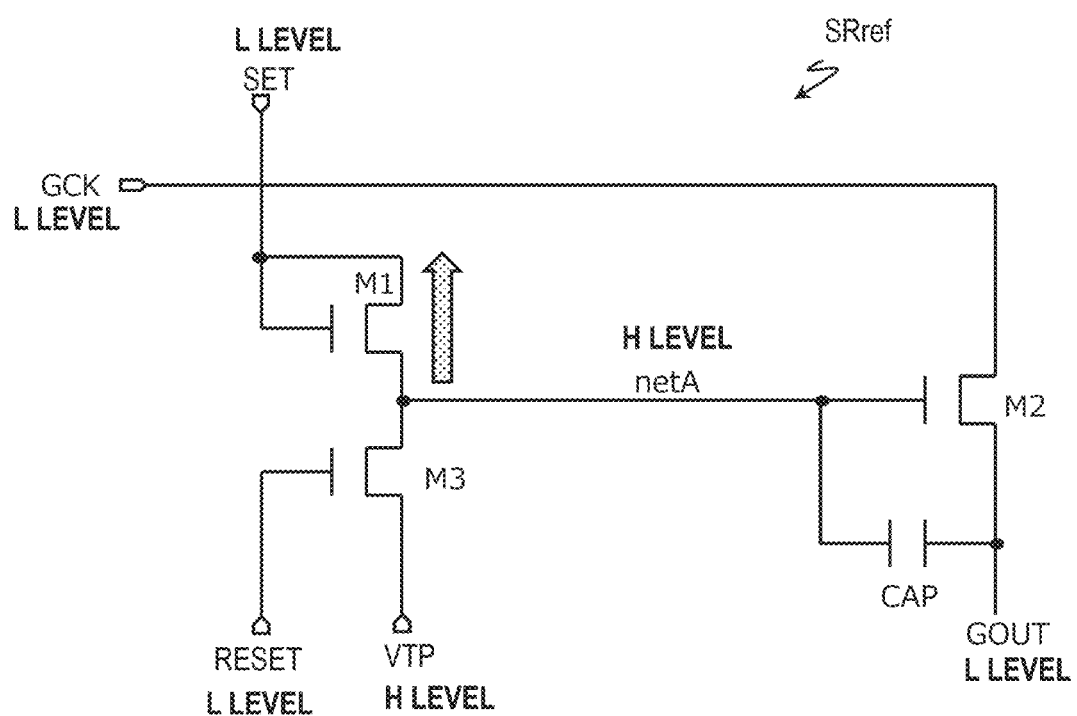
FIG. 5B is a diagram illustrating a potential level of each terminal in a pause period of a unit circuit SRref according to a reference example.

FIGS. 5A and 5B are diagrams for explaining operations of the unit circuit SR of the present embodiment and the unit circuit SRref of the reference example in the pause period SP, respectively.

As illustrated in FIG. 5B, in the unit circuit SRref of the reference example provided with the diode connection type set transistor, when the set signal is maintained at the L level in the pause period SP in which the control signal VTP is at the H level, electric charge easily flow (off-leak) from the source terminal side at the H level to the drain terminal side at the L level in the transistor M1. As a result, the potential of the first node netA may decrease. In particular, the longer the pause period SP, the greater the decrease in the potential of the first node netA. Thus, scanning may not be resumed (the unit circuit in the next stage may not be activated).

In contrast, as illustrated in FIG. 5A, in the unit circuit SR of the present embodiment, the drain terminal side of the transistor M1 is always connected to the VDD terminal, and is fixed to the H level. Thus, in the pause period SP in which the control signal VTP is maintained at the H level, the electric charge of the first node netA is prevented from being released via the transistor M1. Thus, even when the pause period SP is longer, the potential of the first node netA can be maintained high. The H level of the control signal VTP has preferably the same potential as the high-level power supply voltage signal VDD. For such reasons, in the in-cell touch panel, the unit circuit SR including the VDD connection type set transistor may be suitably used.

Note that the configuration of the unit circuit used in the present embodiment is not limited to the illustrated configuration. It is sufficient to include the VDD connection type set transistor of the present embodiment, and four or more transistors may be included. The unit circuit in the present embodiment may have a configuration disclosed in, for example, US 2020/0135132 and JP 2019-74560 A filed by the present applicant. For reference, the entire contents of the disclosure of US 2020/0135132 and JP 2019-74560 A are incorporated herein. The configuration of the unit circuit in the present embodiment may be various unit circuits in which the connection of the set transistor is replaced with the VDD connection in a known unit circuit including the diode connection type set transistor, for example.

Problem of Unit Circuit including VDD Connection Type Set Transistor

The present inventors have found, as a result of investigation, that the following problems may occur in the unit circuit including the VDD connection type set transistor. Note that the following problems are problems that do not occur in the unit circuit including the diode connection type set transistor.

Figure 6:
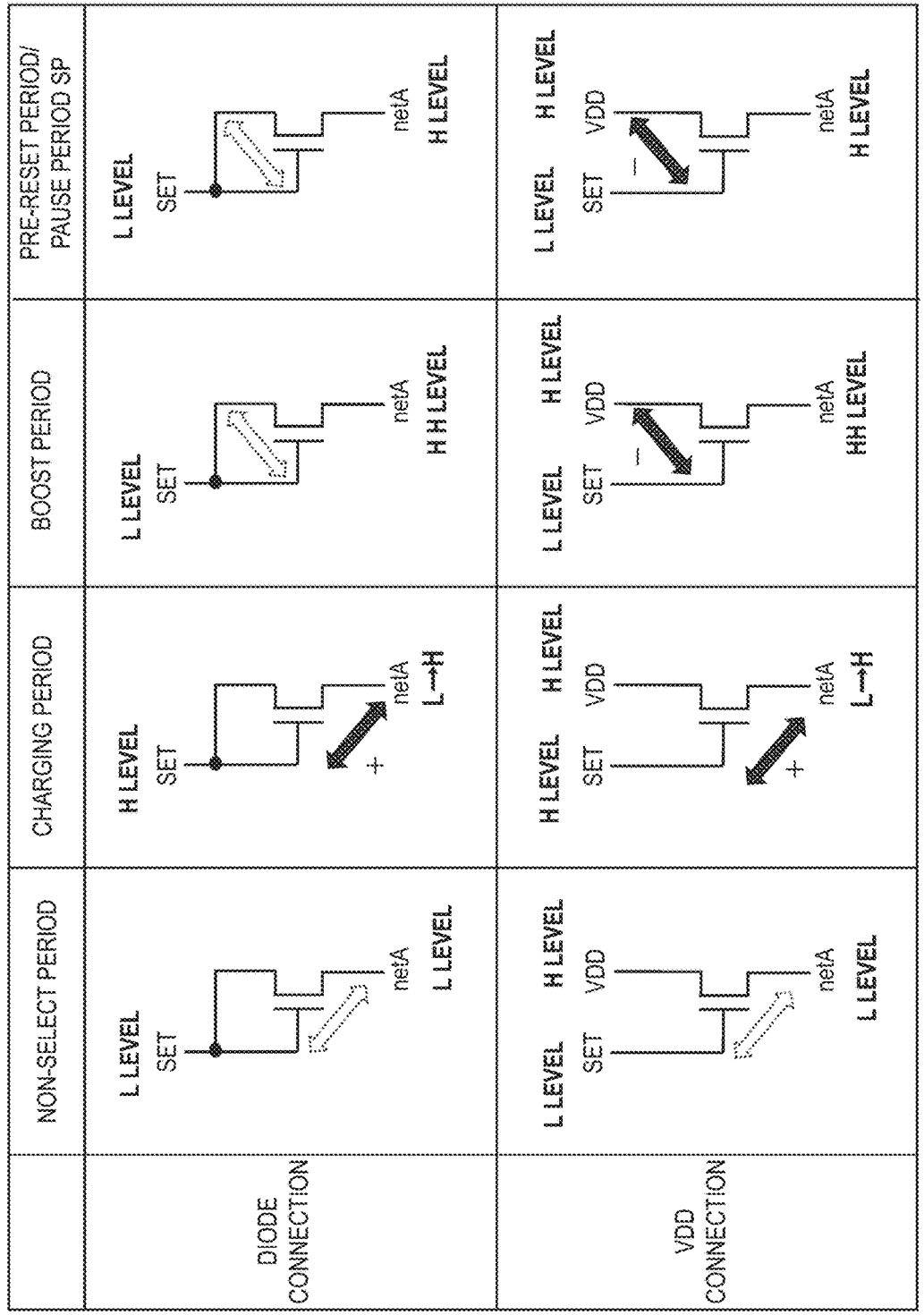
FIG. 6 is a diagram illustrating a potential level of each of a gate terminal, a source terminal, and a drain terminal of a respective one of a diode connection type set transistor and a VDD connection type set transistor.

FIG. 6 is a diagram illustrating potential levels of the gate terminal, the source terminal, and the drain terminal of the diode connection type set transistor and the VDD connection type set transistor in the non-select period, the charging period, the boost period, the pre-reset period, and the pause period SP.

In FIG. 6, a positive bias and a negative bias applied to the gates of the diode connection type set transistor and the VDD connection type set transistor in each of the periods described above are indicated by arrows. "+" for the positive bias and "−" for the negative bias are added to the arrows.

As can be seen from FIG. 6, in the diode connection type set transistor, there is a timing when the positive bias is applied to the gate in the charging period, and thus the threshold voltage of the set transistor may shift in a positive direction (positive voltage direction). Further, there is no timing when the negative bias is applied. Thus it is considered that the threshold voltage shifts only to the positive side. In the present specification, a shift in the positive direction of the threshold voltage of the TFT is referred to as "positive shift", a shift in the negative direction is referred to as "negative shift", and a change amount $\Delta V$th (V) of the threshold voltage is referred to as "shift amount".

On the other hand, in the VDD connection type set transistor, the positive bias is applied to the gate during the charging period, but the negative bias is applied to the gate during the boost period, the pre-reset period, and the pause period SP. Thus, an absolute value of a shift amount in the negative direction by the negative bias is greater than a shift amount in the positive direction by the positive bias, and thus a negative shift of the threshold voltage of the set transistor may occur.

When the negative shift of the threshold voltage occurs in the set transistor, the off-leak current may increase, which may increase power consumption. Further, the threshold voltage may become negative (normally on state), and thus a malfunction may occur.

The problem of the negative shift of the threshold voltage is more significant when the set transistor is the oxide semiconductor TFT. The reason for this is as follows. When light is incident on the channel region of the oxide semiconductor TFT, the threshold voltage is likely to shift to the negative side. It is considered that this is because the oxygen deficiency in the oxide semiconductor increases, and the resistance is reduced by the light being incident on the channel region of the oxide semiconductor layer. In the present specification, degradation caused by light incident on the oxide semiconductor layer is referred to as "light degradation". The present inventors have found, as a result of investigation, that when a negative bias is applied to the gate of the oxide semiconductor TFT for a predetermined time in a state in which the light is incident on the channel region of the oxide semiconductor TFT, the shift of the threshold voltage in the negative side is further increased. Thus, when the oxide semiconductor TFT is used as the set transistor, the negative shift of the threshold voltage is likely to be large. Note that, even other than the oxide semiconductor TFT, the same tendency as described above may occur in a TFT using a high-mobility semiconductor having a relatively high mobility (for example, a mobility of 20 $cm^2/Vs$ or greater, preferably 30 $cm^2/Vs$ or greater). However, the oxide semiconductor layer is particularly easily affected by light and the light degradation is more likely to occur than other semiconductor layers.

The present inventors have also found, as a result of investigation, that the negative shift of the threshold voltage is a problem in the VDD connection type set transistor, but there is no time period in which the negative bias is applied to the gate in the other TFTs such as the output transistor or the pull-down transistor, and the negative shift of the threshold voltage due to light degradation does not occur.

The inventors have found, based on the above findings, that the negative shift of the threshold voltage can be suppressed, and the power consumption can be reduced by applying the "tandem structure" described later to the VDD connection type set transistor in the unit circuit including the VDD connection type set transistor.

Structure of Transistor M1

In the present embodiment, a top gate TFT having the tandem structure is used as the VDD connection type set transistor M1 of each unit circuit SR. In the tandem structure, when viewed from the normal direction of the substrate, the semiconductor layer includes a plurality of channel regions separated from each other in a channel length direction between a source contact region connected to the source electrode and a drain contact region connected to the drain electrode.

Figure 7A:
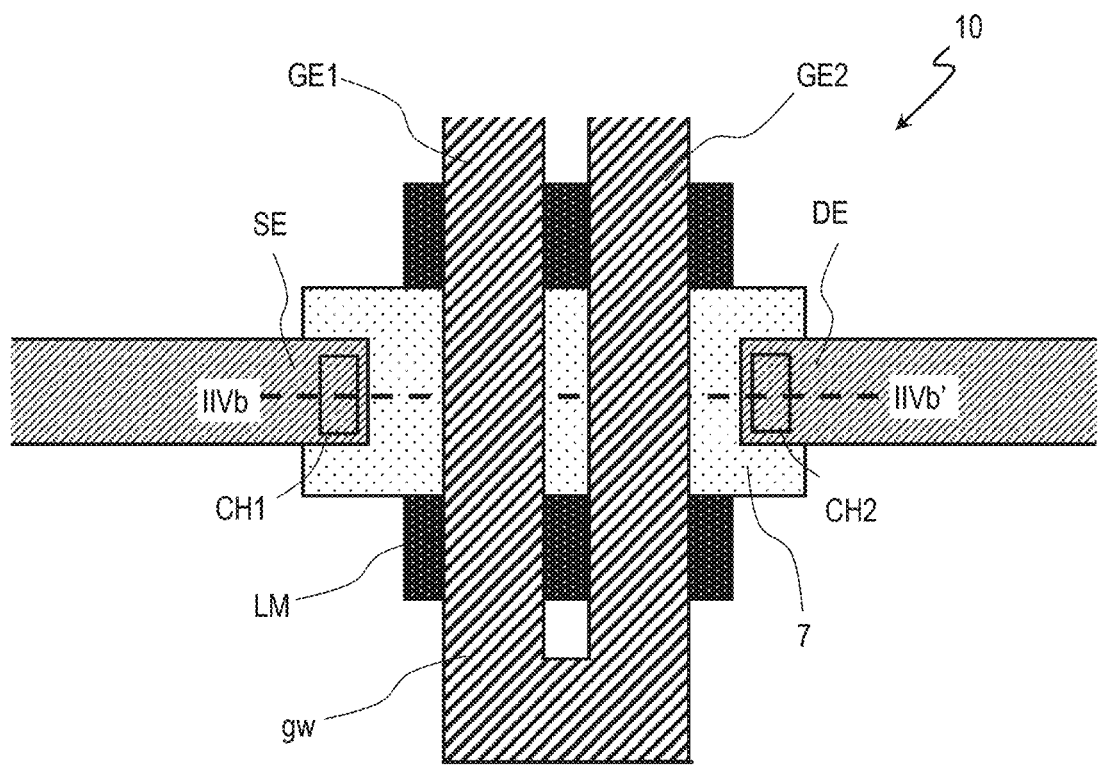
FIG. 7A is a plan view illustrating an example of a TFT having a tandem structure that may be applied to the VDD connection type set transistor.
Figure 7B:
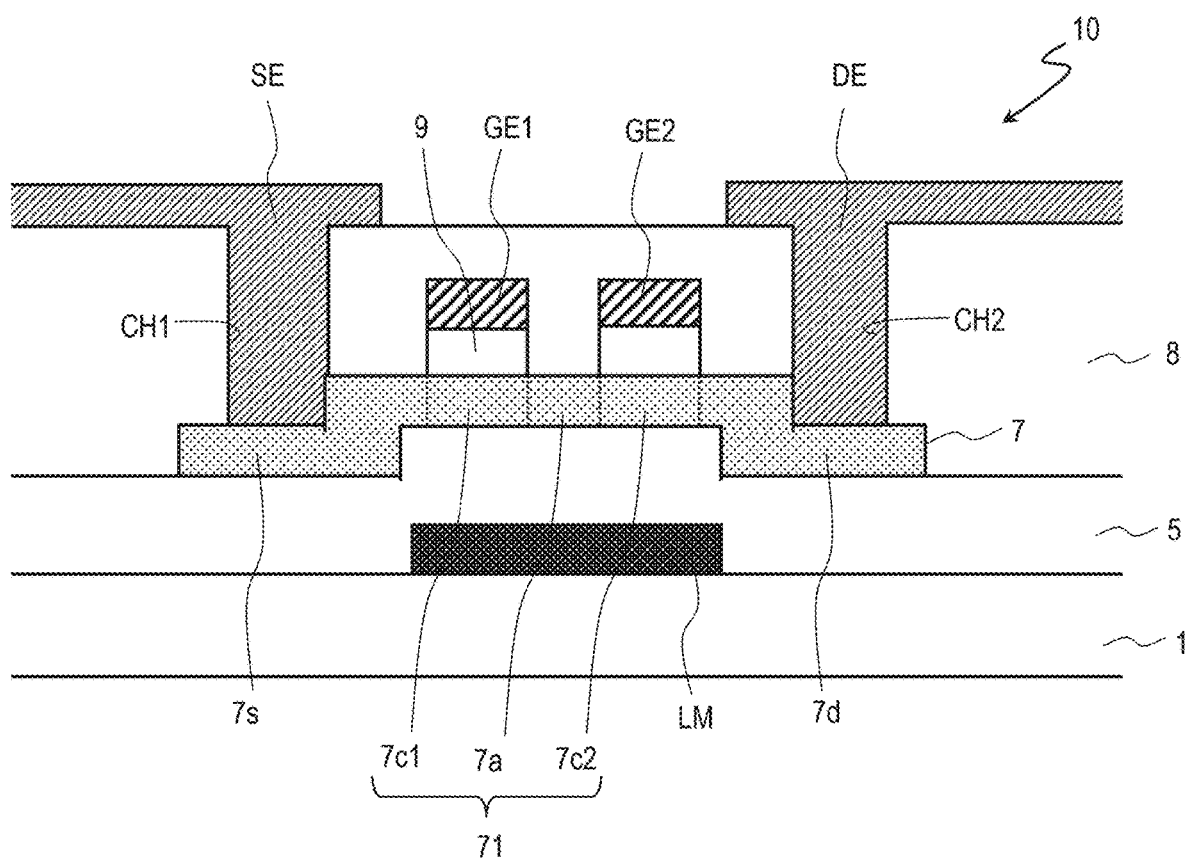
FIG. 7B is a cross-sectional view taken along a line IIVb-IIVb' illustrated in FIG. 7A.

FIG. 7A is a plan view illustrating an example of a TFT having the tandem structure that can be applied to the VDD connection type set transistor. FIG. 7B is a cross-sectional view taken along a line IIVb-IIVb' illustrated in FIG. 7A. Here, a structure of a TFT 10 will be described by taking a case as an example where the TFT 10 is an oxide semiconductor TFT including an oxide semiconductor layer as an active layer. Note that the TFT 10 may be another TFT such as an amorphous silicon TFT and a crystalline silicon TFT.

The TFT 10 includes a semiconductor layer 7, a first gate electrode GE1 and a second gate electrode GE2 located on a side of the semiconductor layer 7 opposite to the substrate 1, an upper gate insulating layer 9 located between each of the first and second gate electrodes GE1 and GE2 and the semiconductor layer 7, and a source electrode (source terminal) SE, and a drain electrode (drain terminal) DE. As illustrated in FIG. 7B, in a cross section that crosses the semiconductor layer 7 in the channel length direction, the first gate electrode GE1 and the second gate electrode GE2 are separated from each other. The TFT 10 may further include a lower conductive layer LM located between the semiconductor layer 7 and the substrate 1, and a lower insulating layer 5 located between the lower conductive layer LM and the semiconductor layer 7.

The semiconductor layer 7 may be, for example, an oxide semiconductor layer. When viewed from the normal direction of a main surface of the substrate 1, the semiconductor layer 7 includes a plurality of channel regions 7c separated from each other in the channel length direction. In the present example, when viewed from the normal direction of the main surface of the substrate 1, the semiconductor layer 7 includes a first channel region 7c1 and a second channel region 7c2 separated from each other, an intervening region 7a, a source contact region 7s, and a drain contact region 7d.

When viewed from the normal direction of the substrate 1, the first channel region 7c1 and the second channel region 7c2 are regions overlapping the first gate electrode GE1 and the second gate electrode GE2, respectively. When viewed from the normal direction of the substrate 1, the intervening region 7a is a region located between the first channel region 7c1 and the second channel region 7c2. That is, the first channel region 7c1 and the second channel region 7c2 are connected to each other in series via the intervening region 7a. The source contact region 7s is a region electrically connected to the source electrode SE, and the drain contact region 7d is a region electrically connected to the drain electrode DE.

When viewed from the normal direction of the substrate 1, the first channel region 7c1, the second channel region 7c2, and the intervening region 7a are located between the source contact region 7s and the drain contact region 7d. The source contact region 7s, the drain contact region 7d, and the intervening region 7a are low-resistive regions having a lower specific resistance than the first channel region 7c1 and the second channel region 7c2. The source contact region 7s, the drain contact region 7d, and the intervening region 7a may be conductive regions.

The first gate electrode GE1 overlaps the first channel region 7c1 via the upper gate insulating layer 9, and the second gate electrode GE2 overlaps the second channel region 7c2 via the upper gate insulating layer 9. The gate electrodes GE1 and GE2 are separated from each other on the semiconductor layer 7 when viewed from the normal direction of the substrate 1. Accordingly, when viewed from the normal direction of the substrate 1, at least a portion of the intervening region 7a is located between the first gate electrode GE1 and the second gate electrode GE2.

The first gate electrode GE1 and the second gate electrode GE2 are electrically connected to each other. When the TFT 10 is used as the set transistor M1, the first gate electrode GE1 and the second gate electrode GE2 are connected to the gate terminal of the set transistor M1.

The first gate electrode GE1 and the second gate electrode GE2 may be integrally formed (in the same layer) using the same conductive film. In the present example, one wiring line gw is provided on the semiconductor layer 7 via the upper gate insulating layer 9. The wiring line gw includes a plurality of (here, two) portions extending across the semiconductor layer 7 in the channel width direction when viewed from the normal direction of the substrate 1, and these portions function as the gate electrodes GE1 and GE2.

Note that the TFT 10 may include three or more gate electrodes. For example, when viewed from the normal direction of the substrate 1, the wiring line gw may include three or more portions extending across the semiconductor layer 7 in the channel width direction and functioning as gate electrodes. As a result, three or more channel regions separated from each other are formed in the semiconductor layer 7. An intervening region being a low-resistive region is formed between two channel regions adjacent to each other. Note that, in the present specification, a region 71 including the plurality of channel regions in the semiconductor layer 7 and one or two or more intervening regions located between the two channel regions adjacent to each other is referred to as "first region".

It is sufficient that the upper gate insulating layer 9 is disposed between the semiconductor layer 7 and each of the first gate electrode GE1 and second gate electrode GE2. In the present example, the upper gate insulating layer 9 is disposed between the wiring line gw and both the semiconductor layer 7 and the lower insulating layer 5, and has a shape that matches the wiring line gw when viewed from the normal direction of the substrate 1. Such a structure is obtained by patterning the upper gate insulating layer 9 by using the etching mask having the same shape as that of the wiring line gw or using the wiring line gw as the etching mask. Note that the wiring line gw may be formed after patterning the upper gate insulating layer 9. In this case, the upper gate insulating layer 9 may cover the entire region of the upper face of the semiconductor layer 7 other than the source contact region 7s and the drain contact region 7d.

The lower conductive layer LM is disposed so as to overlap at least a part of the first channel region 7c1 and/or at least a part of the second channel region 7c2 via the lower insulating layer 5 when viewed from the normal direction of the substrate 1. As a result, backlight light can be prevented from being incident on the first channel region 7c1 and/or the second channel region 7c2, and thus the negative shift of the threshold voltage of the TFT 10 due to the light degradation can be reduced. The lower conductive layer LM may be in an electrically floating state or may be connected to a fixed potential (power supply potential or the like).

In the illustrated example, the lower conductive layer LM is disposed so as to overlap the entirety of the first region 71. That is, the lower conductive layer LM is disposed so as to overlap the entirety of the first channel region 7c1, the entirety of the second channel region 7c2, and the entirety of the intervening region 7a. As a result, the backlight light can be more effectively suppressed to be incidence on the first channel region 7c1 and the second channel region 7c2, and thus the negative shift of the threshold voltage can be more effectively reduced.

The semiconductor layer 7, the first gate electrode GE1, the second gate electrode GE2, and the upper gate insulating layer 9 are covered with an interlayer insulating layer 8. At least one source opening CH1 for exposing the source contact region 7s and at least one drain opening CH2 for exposing the drain contact region 7d are formed in the interlayer insulating layer 8.

The source electrode SE is formed on the interlayer insulating layer 8 and in the source opening CH1, and is connected to the source contact region 7s of the semiconductor layer 7 in the source opening CH1. The drain electrode DE is formed on the interlayer insulating layer 8 and in the drain opening CH2, and is connected to the drain contact region 7d of the semiconductor layer 7 in the drain opening CH2.

Figure 8A:
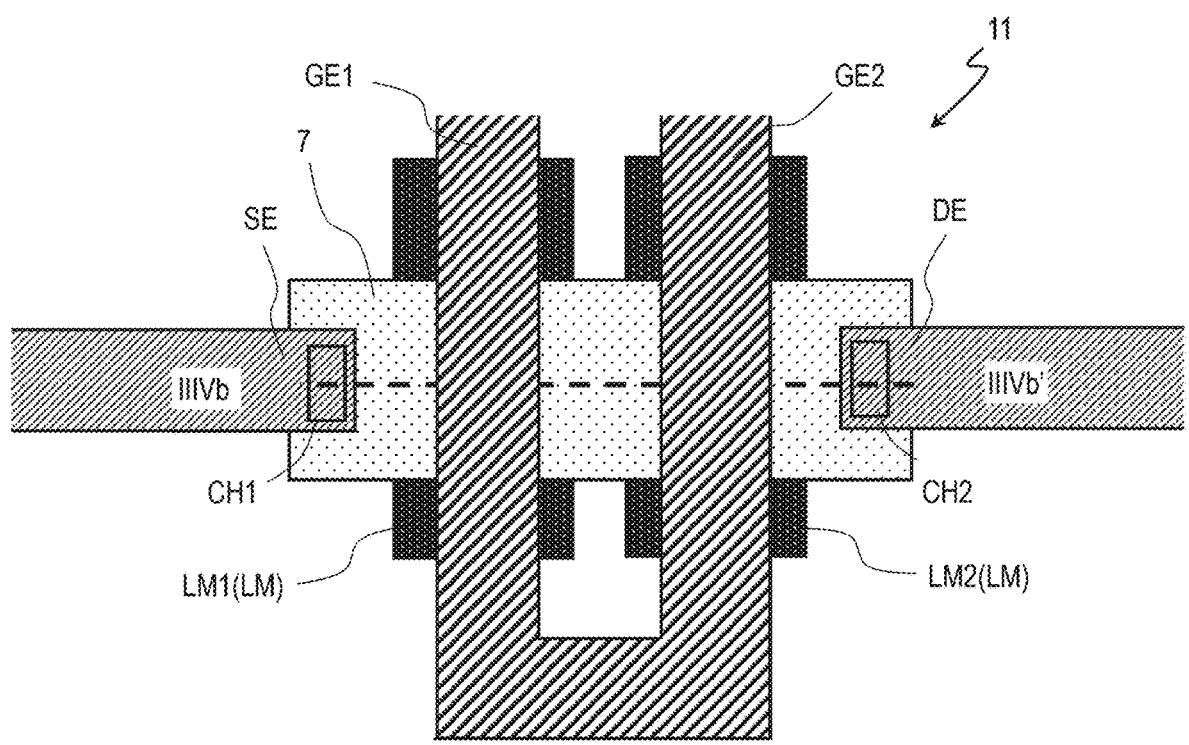
FIG. 8A is a plan view illustrating another example of the TFT having the tandem structure that may be applied to the VDD connection type set transistor.
Figure 8B:
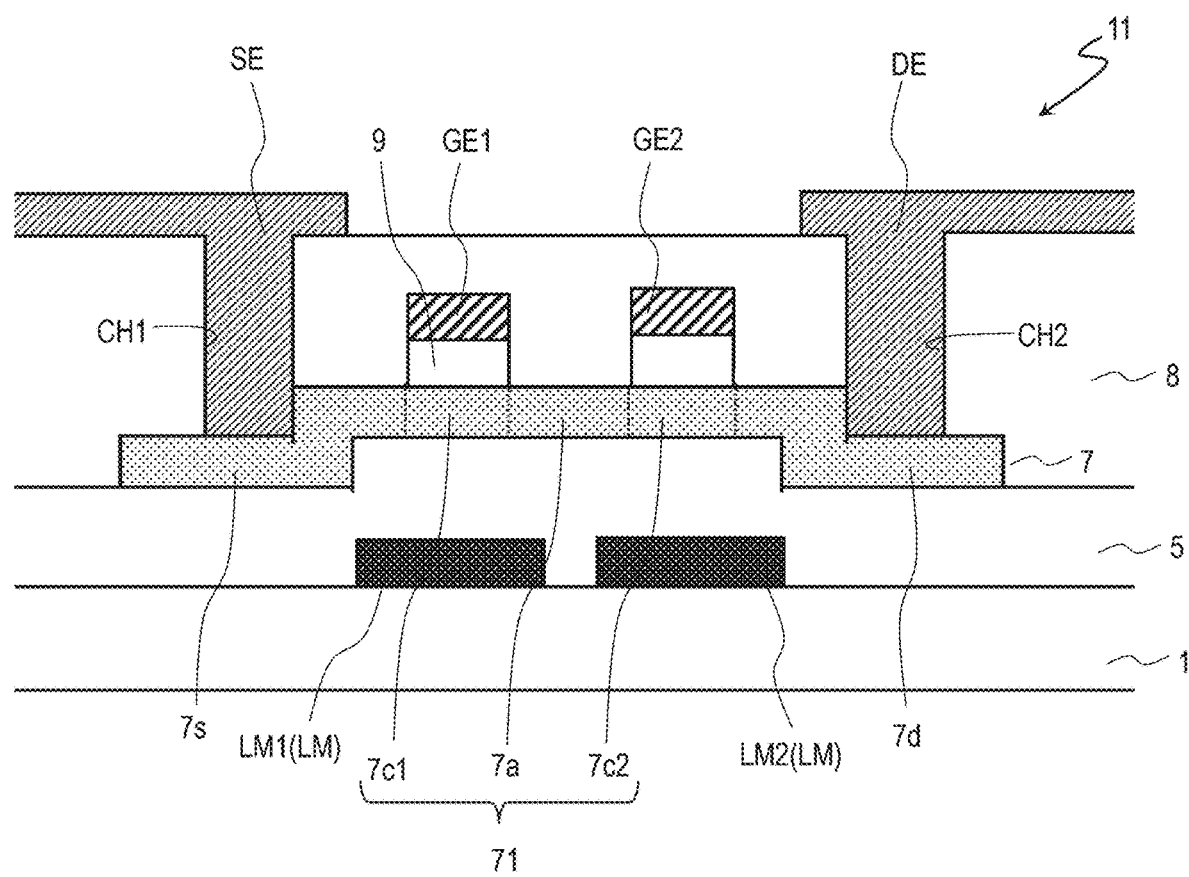
FIG. 8B is a cross-sectional view taken along a line IIIVb-IIIVb' illustrated in FIG. 8A.

FIG. 8A is a plan view illustrating another example of the TFT having the tandem structure. FIG. 8B is a cross-sectional view taken along a line IIIVb-IIIVb' illustrated in FIG. 8A. In FIGS. 8A and 8B, the same reference signs are assigned to the constituent elements similar to those of the TFT 10 illustrated in FIGS. 7A and 7B. To avoid redundant descriptions, the description similar to those of the TFT 10 is omitted as appropriate.

The TFT 11 illustrated in FIGS. 8A and 8B differs from the TFT 10 illustrated in FIGS. 7A and 7B in that the lower conductive layer LM includes a first lower conductive layer LM1 overlapping the first channel region 7c1 and a second lower conductive layer LM2 overlapping the second channel region 7c2 when viewed from the normal direction of the substrate 1. In a region overlapping the semiconductor layer 7, the first lower conductive layer LM1 and the second lower conductive layer LM2 may be separated from each other. When viewed from the normal direction of the substrate 1, at least a part of the intervening region 7a may be located between the first lower conductive layer LM1 and the second lower conductive layer LM2. The first lower conductive layer LM1 and the second lower conductive layer LM2 may be integrally formed using the same conductive film. The first lower conductive layer LM1 and the second lower conductive layer LM2 may be electrically connected to each other by a connection portion (not illustrated). For example, when viewed from the normal direction of the substrate 1, a wiring line including a plurality of portions extending across the semiconductor layer 7 in the channel width direction may be provided, and the plurality of portions may function as the lower conductive layers LM1 and LM2.

According to the present embodiment, the tandem structure described above is applied to the VDD connection type set transistor of each unit circuit included in the gate driver, so that a voltage between the source terminal and the drain terminal of the set transistor can be dispersed to a plurality of (here, two) voltages, and thus the power consumption can be reduced. With the dispersing of the voltage described above, the negative shift (light degradation) of the threshold voltage due to the negative bias applied to the gate terminal of the set transistor can be reduced. As a result, the off-leak current decreases, and thus the power consumption can be further reduced. Further, a malfunction caused by the threshold voltage becoming negative (normally on state) can be suppressed. There is also an advantage that a withstand voltage between the source and the drain can be improved.

As illustrated in TFTs 10 and 11, the VDD connection type set transistor preferably includes the lower conductive layer LM for light blocking of the first channel region 7c1 and the second channel region 7c2. In this manner, the negative shift of the threshold voltage due to light degradation can be more effectively suppressed.

As illustrated in the TFT 10 (FIGS. 7A and 7B), one lower conductive layer LM configured so as to perform light blocking of the plurality of channel regions may be provided. In this manner, light from a substrate back surface side can be more effectively blocked while reducing an area required for the TFT. Accordingly, the negative shift of the threshold voltage due to the light degradation of the TFT can be reduced while suppressing an increase in the circuit area. Note that the lower conductive layer LM may be provided for each channel region (FIG. 8A and FIG. 8B).

The structure of the VDD connection type set transistor is not limited to the structures described above. It is sufficient that a plurality of gate electrodes are provided above the semiconductor layer 7 (on the opposite side to the substrate 1), and the lower conductive layer LM need not be provided. Alternatively, the lower conductive layer LM may function as the lower gate electrode. That is, the VDD connection type set transistor may have a double gate structure in which the gate electrodes are provided on the substrate side of the semiconductor layer and on the opposite side thereto.

Structure of Transistors M2 and M3

Among the TFTs included in the unit circuit SR, TFTs other than the VDD connection type set transistor, such as the output transistor M2 and the pull-down transistor M3 illustrated in FIG. 3, may have a single gate structure in which one gate electrode is included above the semiconductor layer (on the opposite side to the substrate).

Figure 9A:
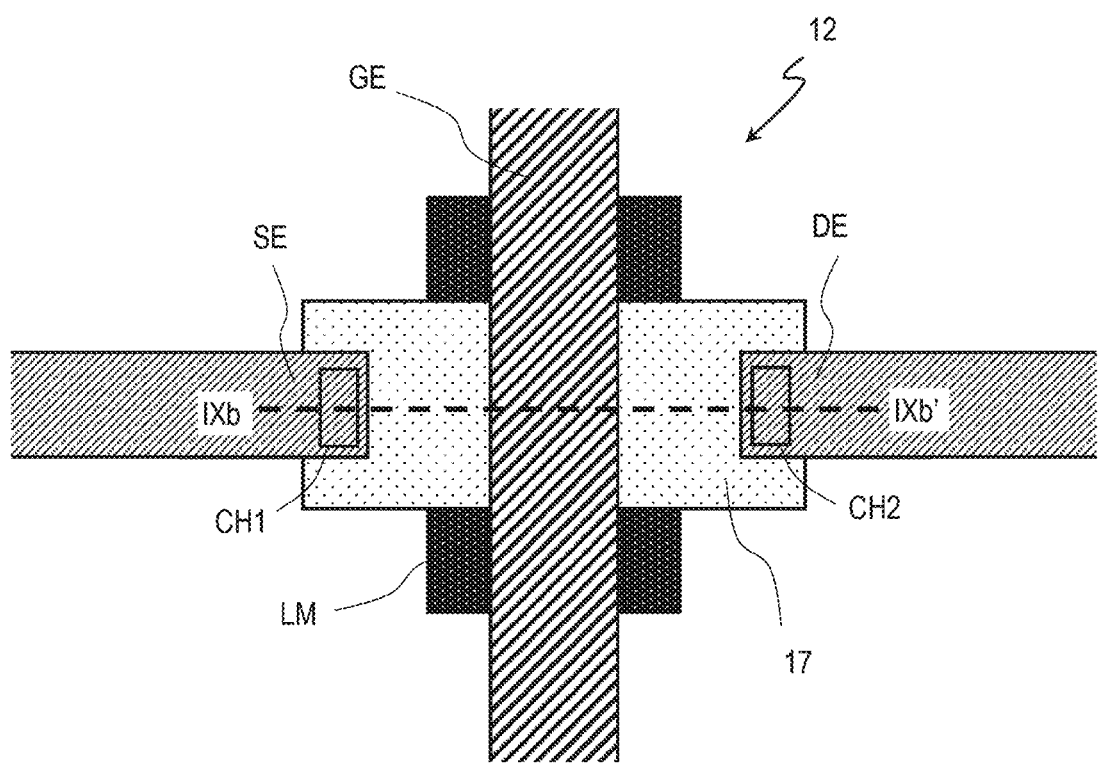
FIG. 9A is a plan view illustrating an example of a TFT having a single gate structure.
Figure 9B:
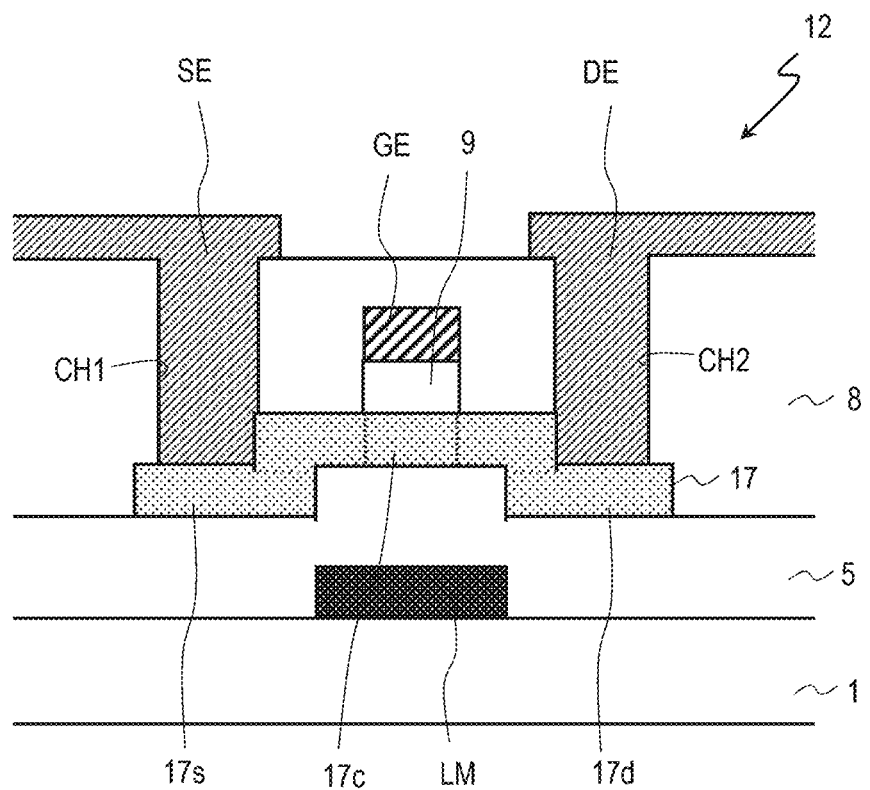
FIG. 9B is a cross-sectional view taken along a line IXb-IXb' illustrated in FIG. 9A.

FIG. 9A is a plan view illustrating an example of a TFT 12 having the single gate structure, and FIG. 9B is a cross-sectional view taken along a line IXb-IXb' illustrated in FIG. 9A. In FIGS. 9A and 9B, the same reference signs are assigned to the constituent elements similar to those of the TFT 10 illustrated in FIGS. 7A and 7B. To avoid redundant descriptions, the description similar to those of the TFT 10 is omitted as appropriate.

The TFT 12 is different from the TFT having the tandem structure in that one gate electrode and one channel region are included. The TFT 12 may be used as the transistors M2 and M3 illustrated in FIG. 3, for example.

The TFT 12 includes the lower conductive layer LM, the lower insulating layer 5 covering the lower conductive layer LM, a semiconductor layer 17 disposed on the lower insulating layer 5, one gate electrode GE disposed on the semiconductor layer 17 with the upper gate insulating layer 9 interposed therebetween, the source electrode SE, and the drain electrode DE. The semiconductor layer 17 includes a source contact region 17s electrically connected to the source electrode SE, a drain contact region 17d electrically connected to the drain electrode DE, and a channel region 17c. The channel region 17c overlaps the gate electrode GE via the upper gate insulating layer 9. The channel region 17c is located between the source contact region 17s and the drain contact region 17d when viewed from the normal direction of the substrate 1.

Figure 10:
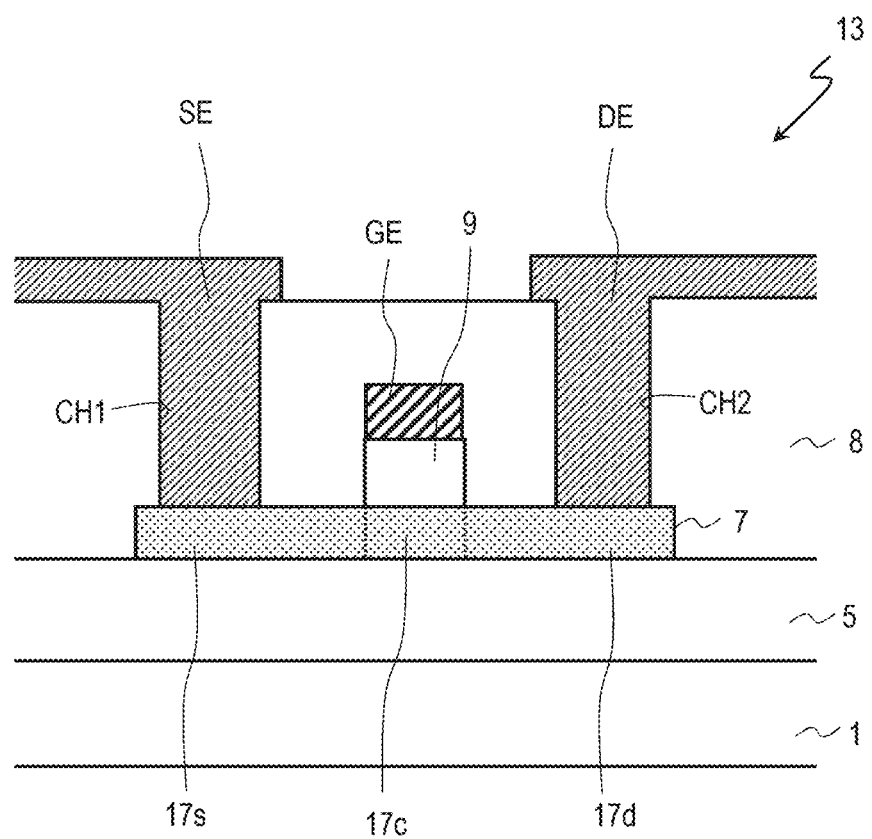
FIG. 10 is a plan view illustrating another example of the TFT having the single gate structure.

It is preferable that the tandem structure is not applied to the transistors M2 and M3. In the transistors M2 and M3, the positive shift of the threshold voltage is likely to occur by applying the positive bias to the gate. If the tandem structure is applied to these transistors, the negative shift of the threshold voltage due to the light degradation in the channel region is suppressed, and thus the shift amount of the threshold voltage in the positive direction increases. As a result, malfunction may occur in the circuit. Further, as the TFTs having the tandem structure increase, the circuit area may increase. On the other hand, if the single gate structure is applied to the transistors M2 and M3 to intentionally cause light degradation, some of the shift amount of the threshold voltage in the positive voltage direction may be offset by the shift amount of the threshold voltage in the negative direction due to the light degradation, and thus the positive shift of the threshold voltage can be suppressed. As illustrated in FIG. 10, as the transistors M2 and M3, a top gate TFT 13 having the single gate structure in which the lower conductive layer LM serving as the light blocking layer is not provided may be used. In the TFT 13 illustrated in FIG. 10, the backlight light is easily incident on the channel region 17c, and thus the light degradation increases. Thus, it is possible to more effectively suppress the positive shift of the threshold voltage by utilizing the light degradation.

In this way, the tandem structure is employed only for the transistor M1 in which the negative shift of the threshold voltage is problematic, and the single gate structure is employed for other transistors (here, transistors M2 and M3), so that each transistor included in the unit circuit can have characteristics required according to the function.

Study on Suppression Effect on Negative Shift of Threshold Voltage

The present inventors applied predetermined stress signals to transistors M1a, M1b, and M1c having different structures in order to confirm suppression effect on the negative shift of the threshold voltage by the tandem structure, and evaluated the shift amount ($\Delta$Vth) of the respective threshold voltages. An evaluation method and results will be described below.

Figure 11A:
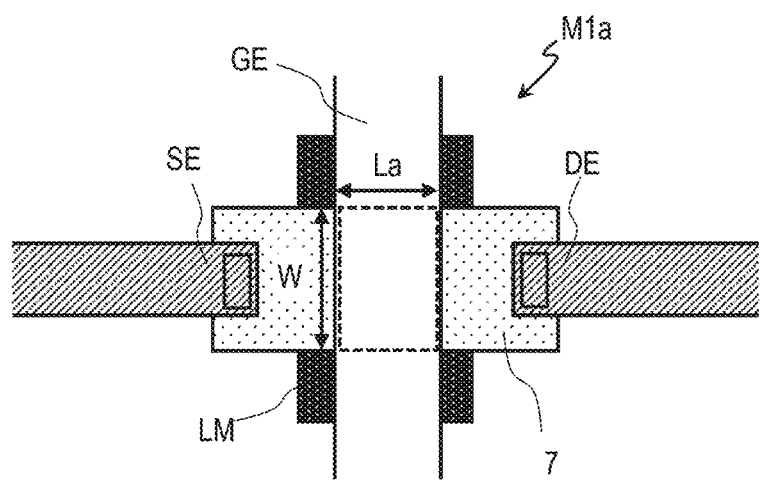
FIG. 11A is a plan view of a transistor M1$a$.
Figure 11B:
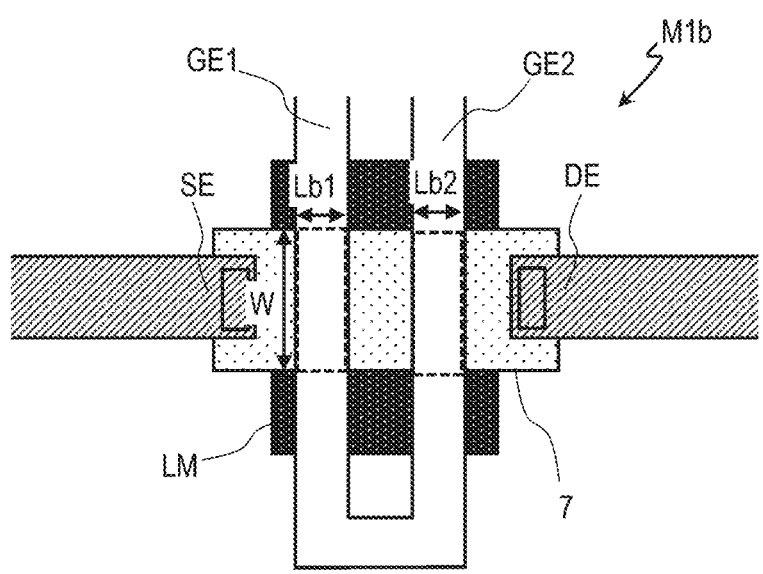
FIG. 11B is a plan view of a transistor M1$b$.
Figure 11C:
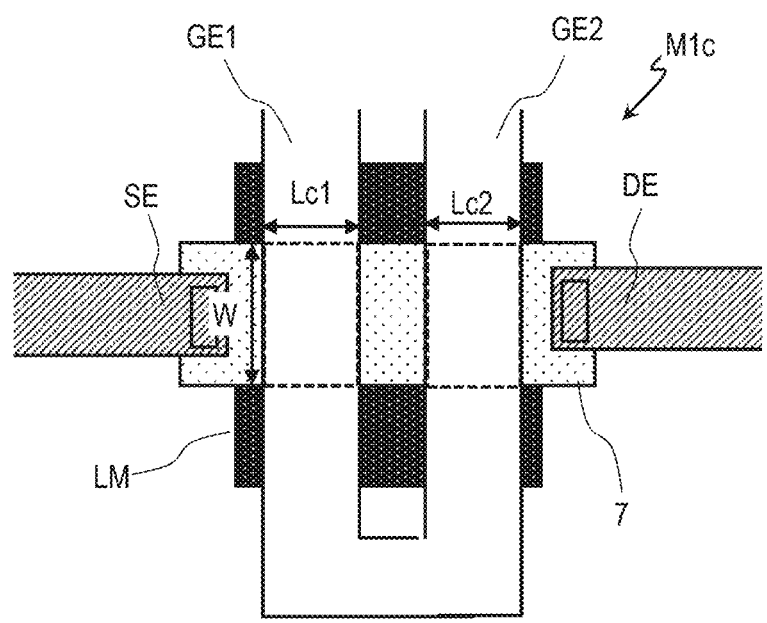
FIG. 11C is a plan view of a transistor M1$c$.

FIGS. 11A to 11C are plan views of the transistors M1a to M1c. The transistor M1a is an oxide semiconductor TFT having the single gate structure similar to the TFT 12 illustrated in FIGS. 9A and 9B. The transistors M1b and M1c are oxide semiconductor TFTs having the tandem structure similar to the TFT 10 illustrated in FIGS. 7A and 7B, respectively. Channel lengths La to Lc of the transistor M1a to M1c and a channel width W are shown in Table 1. Note that in the transistor M1b, the sum of the lengths Lb1 and Lb2 in the channel length direction of the first channel region and the second channel region, respectively, is "channel length Lb". Similarly, in the transistor M1c, the sum of the lengths Lc1 and Lc2 in the channel length direction of the first channel region and the second channel region is "channel length Lc".

TABLE 1

| | Channel length (μm) | Channel width (μm) | $\Delta$Vth (V) |
|---|---|---|---|
| M1a Single gate structure | La = 6 | W = 100 | −0.77 |
| M1b Tandem structure | Lb = 6<br>Lb1 = 3, Lb2 = 3 | | −0.73 |
| M1c Tandem structure | Lc = 12<br>Lc1 = 6, Lc2 = 6 | | −0.61 |

Figure 12:
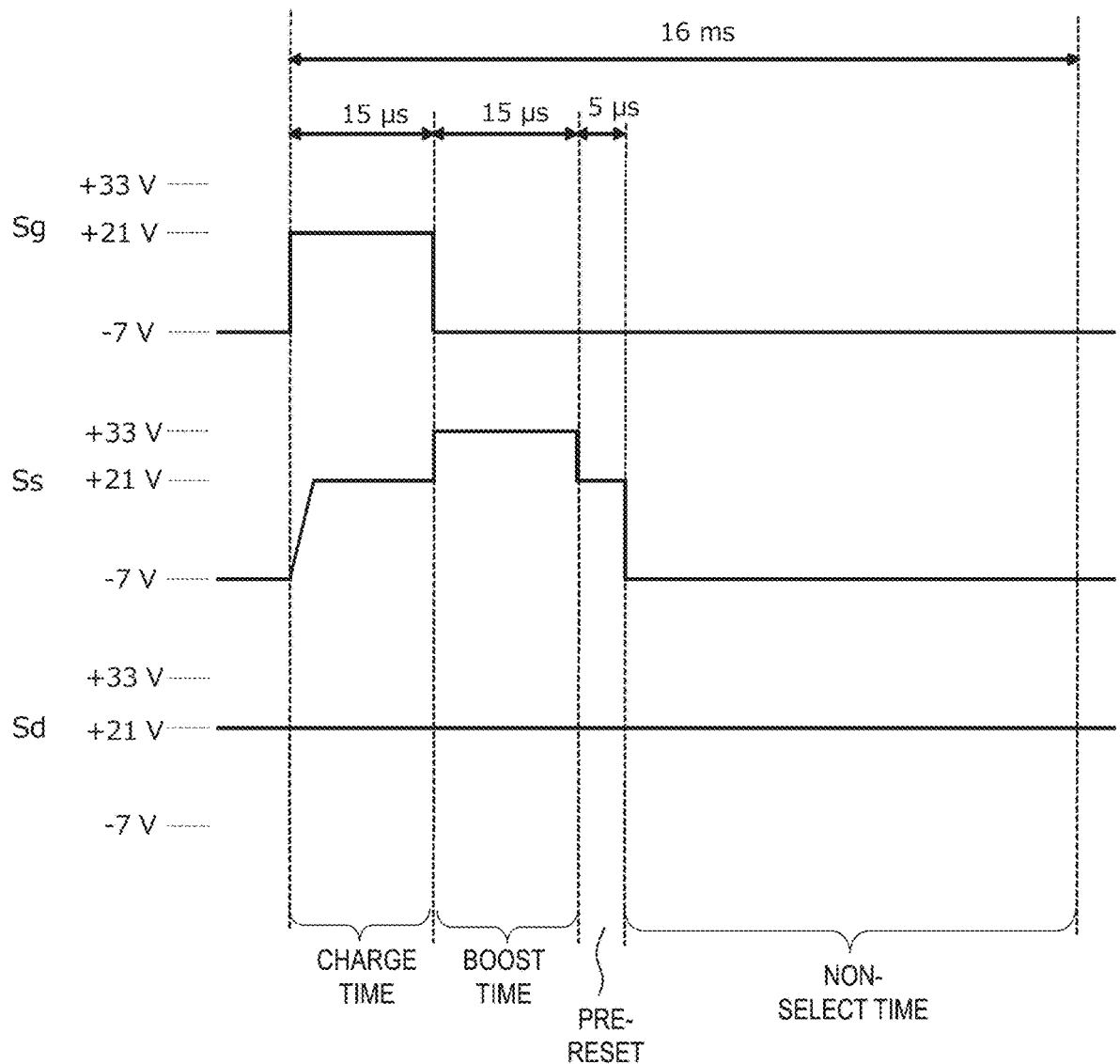
FIG. 12 is a diagram illustrating stress signals Sg, Ss, and Sd applied to a gate, a source, and a drain of each of the transistors M1$a$ to M1$c$, respectively.

FIG. 12 is a diagram illustrating waveforms of stress signals Sg, Ss, and Sd applied to the gate electrode, the source electrode, and the drain electrode of each of the transistors M1a to M1c. The stress signals Sg, Ss, and Sd are signals assumed to be signals input to the gate terminal, the source terminal, and the drain terminal, respectively, of the VDD connection type set transistor, and have waveforms similar to that of the set signal, the first node netA, and the high-level power supply voltage signal VDD, respectively, illustrated in FIG. 4A. Stress conditions in applying the stress signal will be described below.

Stress Conditions

Temperature: 60° C.

Irradiated with backlight light from the substrate back surface side (approximately 4500 cd)

Stress signal application time: 4 hours

Figure 13A:
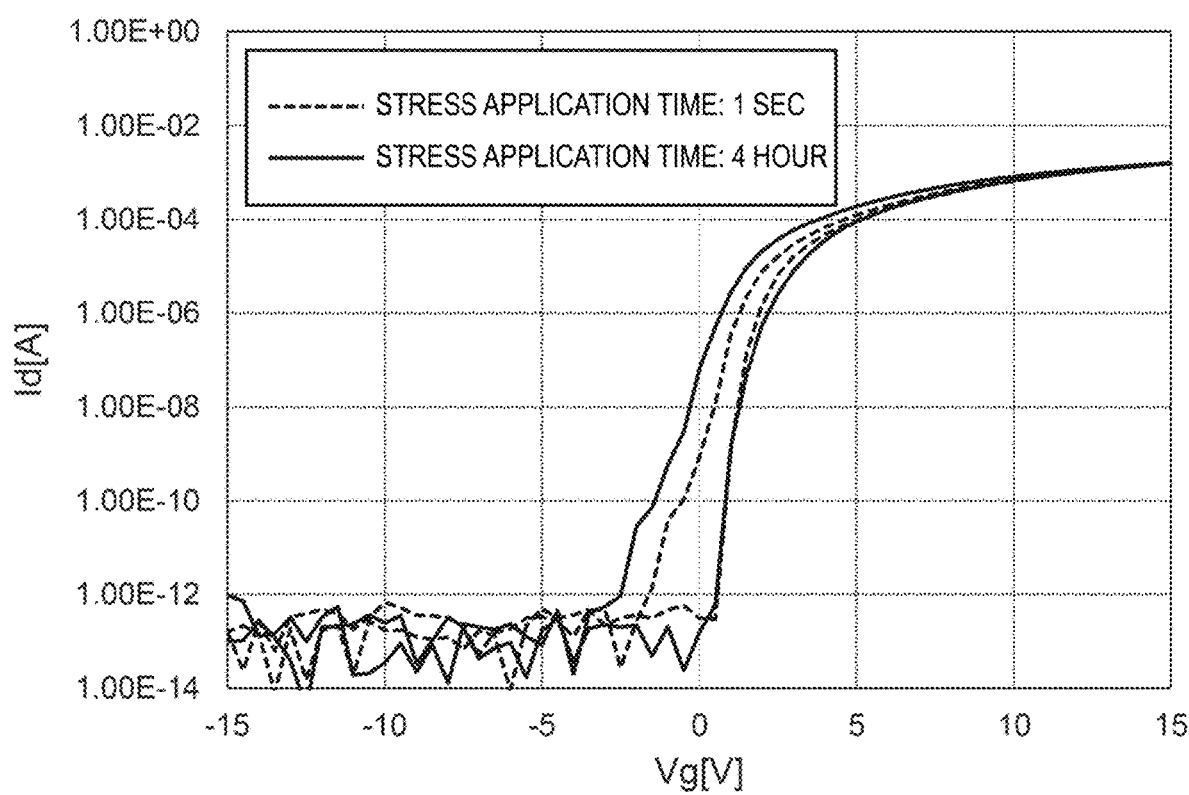
FIG. 13A is a diagram showing an evaluation result of Id-Vg characteristics of the transistor M1$a$.
Figure 13B:
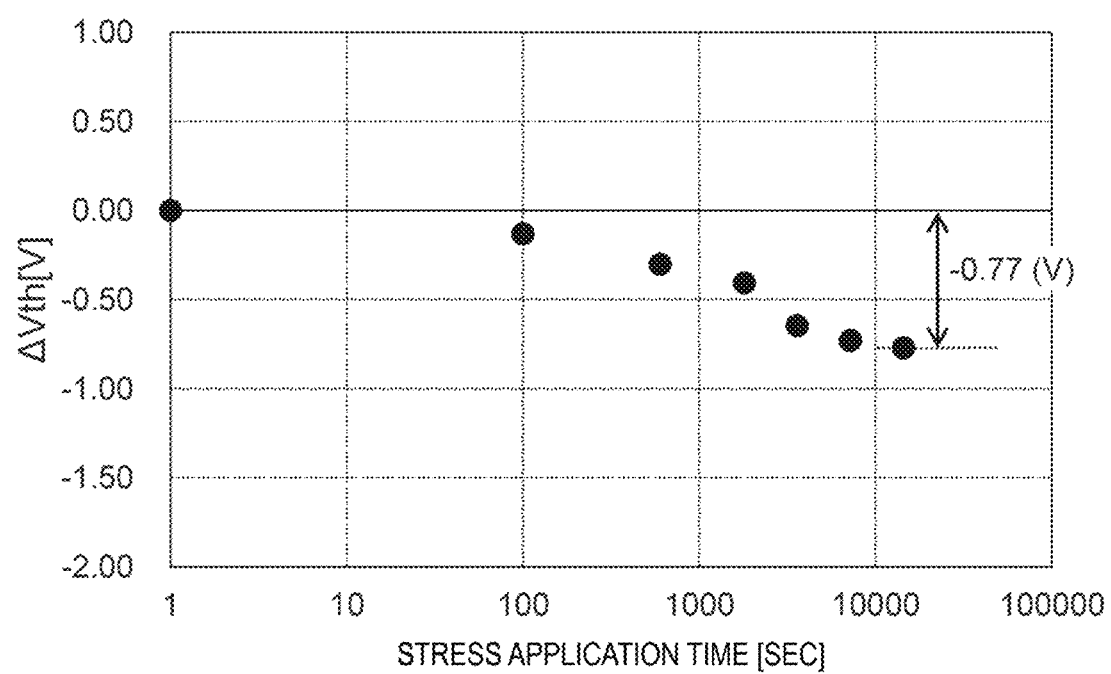
FIG. 13B is a diagram showing a relationship between stress application time and a shift amount ΔVth of a threshold voltage Vth in the transistor M1$a$.
Figure 14A:
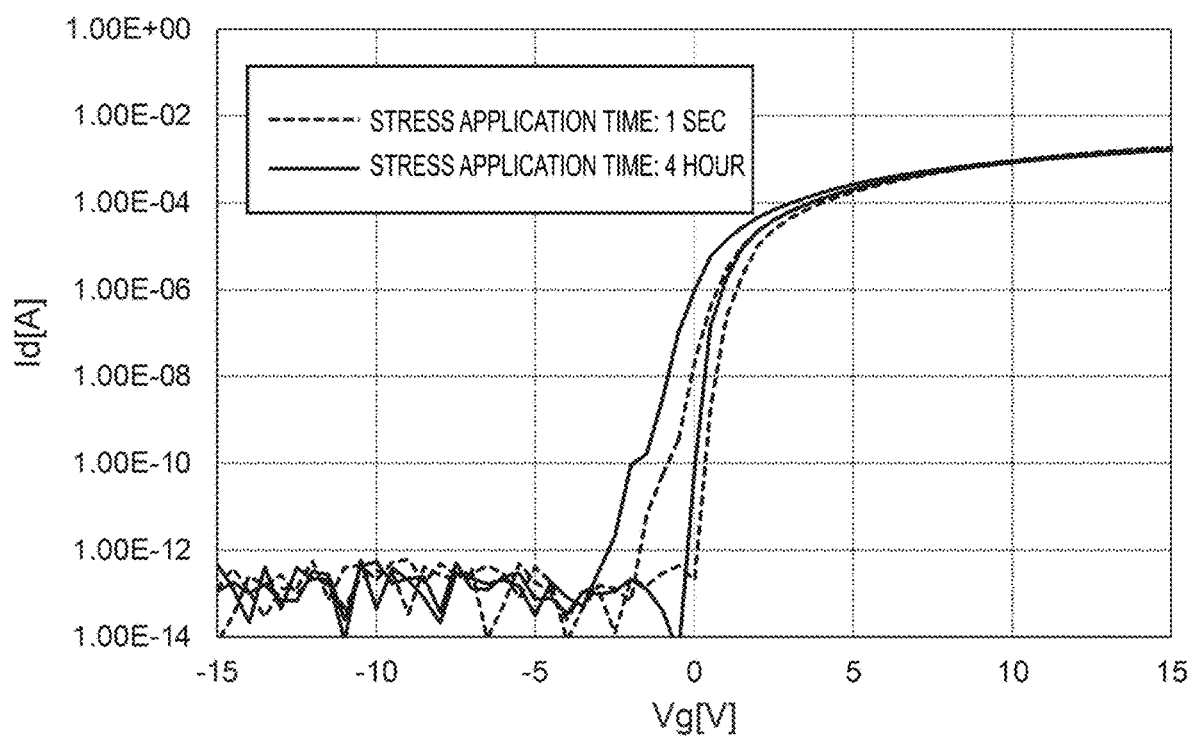
FIG. 14A is a diagram showing an evaluation result of Id-Vg characteristics of the transistor M1$b$.
Figure 14B:
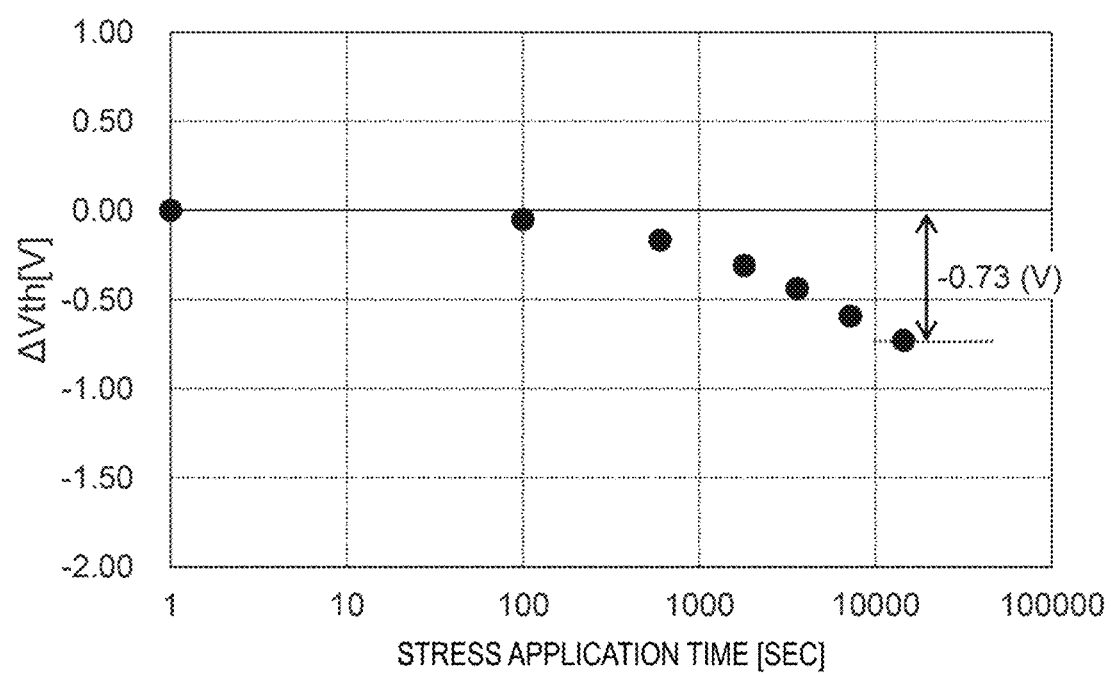
FIG. 14B is a diagram showing a relationship between stress application time and a shift amount ΔVth of a threshold voltage Vth in the transistor M1$b$.
Figure 15A:
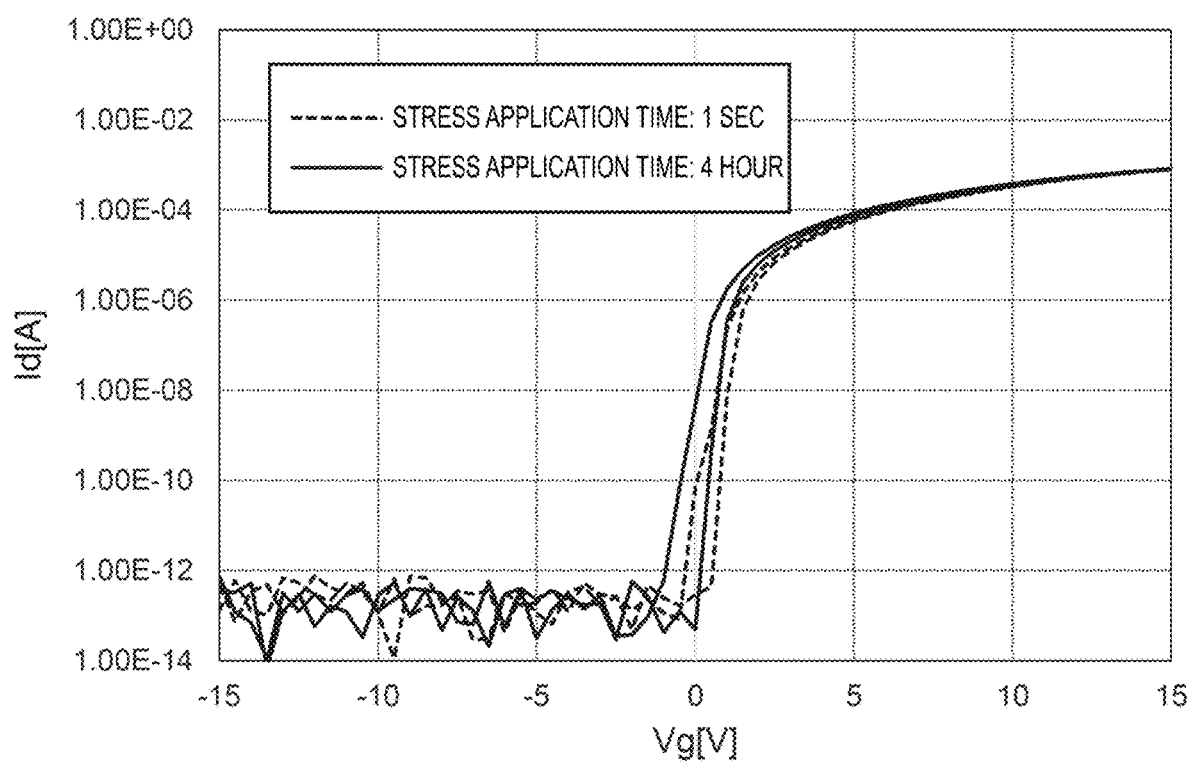
FIG. 15A is a diagram showing an evaluation result of Id-Vg characteristics of the transistor M1$c$.
Figure 15B:
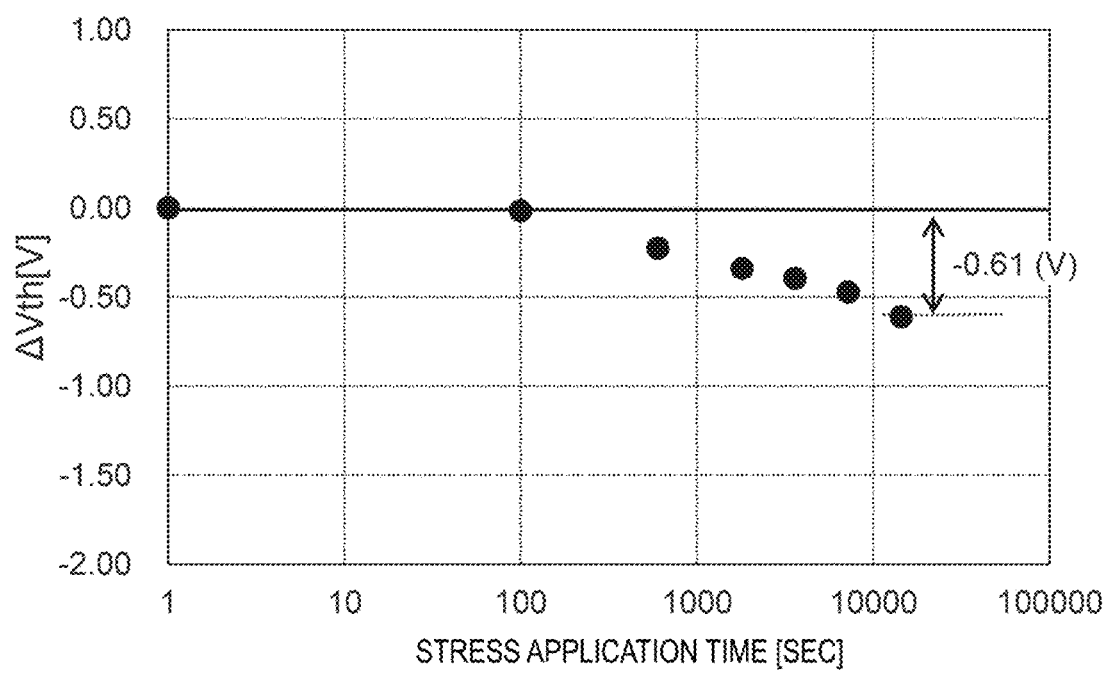
FIG. 15B is a diagram showing a relationship between stress application time and a shift amount ΔVth of a threshold voltage Vth in the transistor M1$c$.

The results are shown in FIGS. 13A to 15B. FIGS. 13A, 14A and 15A are diagrams showing Id-Vg characteristics of the transistors M1a, M1b, and M1c, respectively. In these diagrams, characteristics immediately after the start of the application of the stress signal (stress application time: 1 second) are shown in dashed lines, and characteristics after the application of the stress signal for four hours are shown in solid lines. The horizontal axis of the graph represents a potential (gate-drain voltage) Vg of the gate electrode with the potential of the drain electrode as a reference, and the vertical axis of the graph represents a drain current Id. FIGS. 13B, 14B, and 15B are diagrams showing relationships between stress application time and a shift amount $\Delta$Vth of a threshold voltage Vth in the transistor M1a, M1b, and M1c, respectively.

Figure 16:
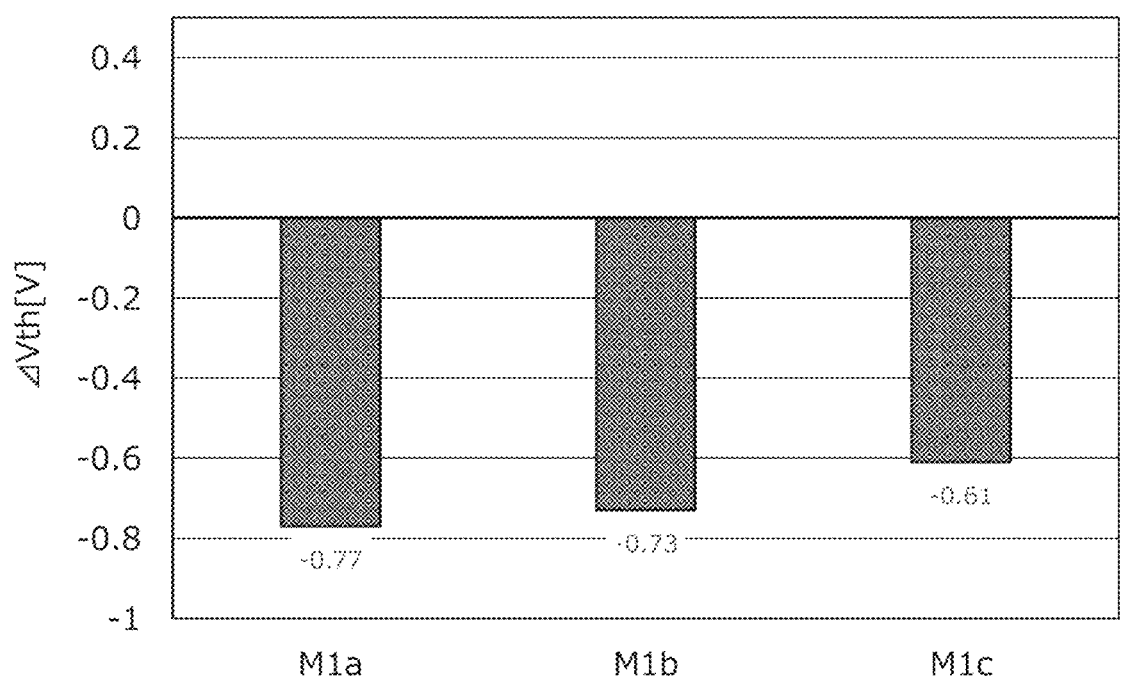
FIG. 16 is a diagram showing each of the shift amounts ΔVth of the threshold voltage of a respective one of the transistors M1$a$ to M1$c$ due to a stress signal application for four hours.

FIG. 16 and the Table 1 show the shift amount ΔVth of the threshold voltage of each of the transistors M1a to M1c due to the stress signal application for four hours.

As can be seen from the results shown in FIG. 16, in any of the transistors M1a to M1c, the threshold voltage Vth shifted in the negative direction (ΔVth<0 (V)). It is considered that this is because the negative bias was applied to the gate of each of the transistors M1a to M1c (see FIG. 6) in a period assuming the "pre-reset period" illustrated in FIG. 12, and the negative shift due to the light degradation occurred.

In comparison between the evaluation results of the transistors M1a and M1b having the same channel length, the shift amount ΔVth of the threshold voltage Vth in the negative direction in the transistor M1b having the tandem structure was smaller than that in the transistor M1a having the single gate structure. From this, it was confirmed that employing the tandem structure to disperse the source-drain voltage allows the shift amount ΔVth of the threshold voltage Vth in the negative direction to be reduced. In comparison between the evaluation results of the transistors M1b and M1c having the tandem structure, the shift amount ΔVth of the threshold voltage Vth in the negative direction in the transistor M1c having a longer channel length was smaller than that in the transistor M1b. Thus, it was found that increasing the channel length (the sum of lengths of the plurality of channel regions in the channel length direction) allows the shift amount in the negative direction to be more effectively reduced.

Note that the stress signals illustrated in FIG. 12 do not include a period assuming the pause period SP of the scanning. When the pause period SP is provided, time during which the negative bias is applied to the gate of each of the transistors M1a to M1c is significantly increased, and thus the negative shift (absolute value of the shift amount ΔVth) of the threshold voltage Vth with respect to the stress application time of the transistor M1a is further increased, and it is considered that the difference from the shift amount ΔVth of the transistors M1b and M1c having the tandem structure further increases. That is, it is considered that the suppression effect on the negative shift by applying the tandem structure is further pronounced.

Method of Manufacturing Set Transistor having Tandem Structure

Next, the method of manufacturing the set transistor M1 used in the unit circuit SR according to the present embodiment will be described taking the TFTs 10 and 11 illustrated in FIGS. 7A and 8A as examples.

First, a not-illustrated lower conductive film (having a thickness of, for example, 50 nm or greater and 500 nm or less) is formed on the insulating substrate (for example, a glass substrate) 1 by sputtering or the like. Next, the lower conductive film is patterned to obtain the lower conductive layer LM.

A glass substrate, a silicon substrate, a plastic substrate (resin substrate) having heat resistance, or the like can be used as the substrate 1, for example.

As the lower conductive film, for example, a metal film containing an element selected from aluminum (Al), chromium (Cr), copper (Cu), tantalum (Ta), titanium (Ti), molybdenum (Mo), or tungsten (W), or an alloy film containing these elements as components can be used. A layered film including a plurality of films of these films may be used. For example, a layered film having a triple-layer structure of titanium film-aluminum film-titanium film, or a triple-layer structure of molybdenum film-aluminum film-molybdenum film can be used. Here, as the lower conductive film, a layered film having a Ti film (having a thickness from 15 to 70 nm) as a lower layer and a Cu film (having a thickness from 200 to 400 nm) as an upper layer is used.

Subsequently, the lower insulating layer (having a thickness of, for example, 200 nm or greater and 500 nm or less) 5 is formed to cover the lower conductive layer LM.

Examples of the lower insulating layer 5 appropriately include a silicon oxide ($SiO_2$) layer, a silicon nitride (SiNx) layer, a silicon oxynitride (SiOxNy; x>y) layer, a silicon nitride oxide (SiNxOy; x>y) layer, an aluminum oxide layer, a tantalum oxide layer, or the like. The lower insulating layer 5 may have a layered structure. Here, for example, the lower insulating layer 5 having a structure forming a layered film having a lower layer of a silicon nitride (SiNx) layer (having a thickness from 100 to 500 nm) and an upper layer of a silicon oxide ($SiO_2$) layer (having a thickness from 100 to 500 nm) is formed by CVD.

Thereafter, the semiconductor film is formed on the lower insulating layer 5 and patterned to obtain the semiconductor layer 7. Here, as the semiconductor film, for example, the oxide semiconductor film (e.g., having a thickness of 15 nm or greater and 200 nm or less) is formed by sputtering.

Subsequently, an upper insulating film (having a thickness of, for example, 80 nm or greater and 250 nm or less) and a gate conductive film (having a thickness of, for example, 50 nm or greater and 500 nm or less) are formed in this order to cover the semiconductor layer 7. As the upper insulating film, an insulating film similar to the lower insulating layer 5 (an insulating film exemplified as the lower insulating layer 5) can be used. A conductive film similar to the lower conductive film can be used as the gate conductive film. Here, for example, a silicon oxide ($SiO_2$) film is used as the upper insulating film. As the gate conductive film, a layered film having a Ti film (having a thickness from 15 to 70 nm) as a lower layer and a Cu film (having a thickness from 200 to 400 nm) as an upper layer is used.

Subsequently, a resist mask (not illustrated) is used to pattern the gate conductive film, and the wiring line gw including the gate electrodes GE1 and GE2 is formed. The gate conductive film can be patterned, for example, by wet etching or dry etching.

Subsequently, patterning of the upper insulating film is performed by using the resist mask described above to obtain the upper gate insulating layer 9. Thereafter, the resist mask is removed. Note that, after removing the resist mask, the upper insulating film may be subjected to etching by using the wiring line gw as a mask.

In this process, the upper gate insulating layer 9 and the wiring line gw are formed using the same mask, so the side surface of the upper gate insulating layer 9 and the side surface of the wiring line gw are aligned in the thickness direction. That is, a peripheral edge of the upper gate insulating layer 9 matches a peripheral edge of the wiring line gw when viewed from the normal direction of the substrate 1.

Thereafter, a processing for lowering the resistance of the semiconductor layer 7 may be performed. Plasma processing may be performed as the processing for lowering the resistance, for example. In the plasma processing, reducing plasma or plasma containing a doping element (for example, argon plasma) may be used. As a result, when viewed from the normal direction of the main surface of the substrate 1, a region (including the intervening region 7a and regions serving as the source contact region and the drain contact region) overlapping the gate electrodes GE1 and GE2 of the semiconductor layer 7 is lowered in resistance than a region (the channel regions 7c1 and 7c2) overlapping the gate electrodes GE1 and GE2, and becomes a low-resistive region having lower specific resistance. The low-resistive region may be a conductive region (for example, sheet resistance equal to or less than 200Ω/□).

Subsequently, the interlayer insulating layer (having a thickness of, for example, 100 nm or greater and 500 nm or less) 8 is formed to cover the semiconductor layer 7, the upper gate insulating layer 9, and the wiring line gw. Thereafter, the openings CH1 and CH2 that reaches the semiconductor layer 7 is formed in the interlayer insulating layer 8 by dry etching, for example.

The interlayer insulating layer 8 can be formed with a single-layer or a multi-layer of a silicon oxide film, a silicon nitride film, a silicon oxynitride film, and a silicon nitride oxide film. Here, an SiNx layer (having a thickness of 300 nm) is formed as the interlayer insulating layer 8 by the CVD, for example. When a reducing insulating film (for example, SiNx film) that can reduce the oxide semiconductor is used as the interlayer insulating layer 8, a rise in specific resistance of a portion in contact with the interlayer insulating layer 8 of the semiconductor layer 7 can be suppressed. Note that, instead of the plasma processing described above, the reducing insulating film as the interlayer insulating layer 8 may be formed to lower resistance of the portion in contact with the interlayer insulating layer 8 of the semiconductor layer 7.

Subsequently, a source conductive film (having a thickness of, for example, 50 nm or greater and 500 nm or less) is formed on the interlayer insulating layer 8 and in the openings CH1 and CH2, and then the source conductive film is patterned. The patterning can be performed by dry etching or wet etching. In this manner, the source electrode SE in contact with the semiconductor layer 7 in the source opening CH1 and the drain electrode DE in contact with the semiconductor layer 7 in the opening CH2 are obtained. In this manner, the TFT 10 is manufactured.

As the source conductive film, an element selected from aluminum (Al), chromium (Cr), copper (Cu), tantalum (Ta), titanium (Ti), molybdenum (Mo), and tungsten (W), or an alloy containing these elements as components can be used, for example. For example, the source conductive film may have a triple-layer structure of titanium film-aluminum film-titanium film, or a triple-layer structure of molybdenum film-aluminum film-molybdenum film. Note that the source conductive film is not limited to the triple-layer structure, and may have a single-layer or a dual-layer structure, or a layered structure of four or more layers. Here, a layered film having a Ti film (having a thickness from 15 to 70 nm) as a lower layer and a Cu film (having a thickness from 200 to 400 nm) as an upper layer is used.

Although not illustrated, a passivation film (for example, an inorganic insulating layer such as a SiNx layer) may be provided to cover the TFT 101.

The transistors M2 and M3 (for example, TFTs 12 and 13 having the single drain structure) may also be manufactured in a process common to the transistor M1. For example, the TFT 12 can be manufactured in a similar manner as described above by varying the shapes and the sizes of the semiconductor layer 7, the wiring line gw including the portions functioning as the gate electrodes, the lower conductive layer LM functioning as the light blocking layer, and the like.

Oxide Semiconductor

When the semiconductor layer 7 is an oxide semiconductor layer, the oxide semiconductor may be an amorphous oxide semiconductor, or may be a crystalline oxide semiconductor including a crystalline portion. Examples of the crystalline oxide semiconductor include a polycrystalline oxide semiconductor, a microcrystalline oxide semiconductor, a crystalline oxide semiconductor having a c-axis oriented substantially perpendicular to the layer surface and the like.

The oxide semiconductor layer may have a layered structure including two or more layers. When the oxide semiconductor layer has the layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. The oxide semiconductor layer may include a plurality of amorphous oxide semiconductor layers. In a case where the oxide semiconductor layer has a dual-layer structure including an upper layer and a lower layer, an energy gap of the oxide semiconductor included in a layer positioned on the gate electrode side (that is the lower layer in the case of the bottom gate type, and the upper layer in the case of the top gate type) of the two layers may be smaller than an energy gap of the oxide semiconductor included in a layer positioned opposite to the gate electrode (that is the upper layer in the case of the bottom gate type, and the lower layer in the case of the top gate type). Note that, in a case where a difference in the energy gap between these layers is relatively small, the energy gap of the oxide semiconductor included in the layer positioned on the gate electrode side may be greater than the energy gap of the oxide semiconductor included in the layer positioned opposite to the gate electrode.

Materials, structures, and film formation methods of an amorphous oxide semiconductor and the above-described crystalline oxide semiconductors, a configuration of an oxide semiconductor layer having a layered structure, and the like are described in, for example, JP 2014-007399 A. The entire contents of the disclosure of JP 2014-007399 A are incorporated herein by reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of indium (In), gallium (Ga), and zinc (Zn), and a ratio (composition ratio) of In, Ga, and Zn is not particularly limited. For example, the ratio includes In:Ga:Zn=2:2:1, In:Ga:Zn=1:1:1, In:Ga:Zn=1:1:2 or the like. Such an oxide semiconductor layer can be formed of an oxide semiconductor film including an In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein by reference. A TFT including an In—Ga—Zn—O based semiconductor layer has a high mobility (more than 20 times as compared to an a-Si TFT) and a low leakage current (less than $\frac{1}{100}$ as compared to the a-Si TFT). Thus, such a TFT can be suitably used as a driving TFT (for example, a TFT included in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of indium (In), tin (Sn), and zinc (Zn). Alternatively, the oxide semiconductor layer may include an In—W—Zn—O based semiconductor and an In—W—Sn—Zn—O based semiconductor containing tungsten (W), an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, and the like.

The active matrix substrate according to the embodiments of the disclosure can be broadly applied to electronic devices, for example, a display device such as a liquid crystal display device, an organic electroluminescence (EL) display device, and an inorganic electroluminescence display device, an imaging device such as an image sensor device, an image input device, and a fingerprint reader. In particular, the embodiments of the disclosure are preferably applied to liquid crystal display devices with touch sensors.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate comprising:
a substrate;
a plurality of source bus lines and a plurality of gate bus lines supported by the substrate; and
a gate driver configured to selectively drive the plurality of gate bus lines,
wherein the gate driver includes a shift register including a plurality of unit circuits provided corresponding to the plurality of gate bus lines and connected in multiple stages,
each of the plurality of unit circuits receives at least a clock signal and a set signal, the set signal being a start pulse signal or a signal output from a unit circuit of a stage before each of the plurality of unit circuits,
each of the plurality of unit circuits includes
an output node connected to one of the plurality of gate bus lines,
a first node,
a first TFT including a first gate terminal supplied with the set signal, a first source terminal connected to the first node, and a first drain terminal supplied with a first power supply potential higher than a low-level potential of the set signal, and
a second TFT including a second gate terminal connected to the first node, a second source terminal connected to the output node, and a second drain terminal supplied with the clock signal, the first TFT includes
a semiconductor layer, and
a first gate electrode and a second gate electrode disposed on a side of the semiconductor layer opposite to the substrate and connected to the first gate terminal,
the semiconductor layer includes
a source contact region electrically connected to the first source terminal,
a drain contact region electrically connected to the first drain terminal, and
a first channel region and a second channel region separated from each other in a channel length direction between the source contact region and the drain contact region when viewed from a normal direction of the substrate, and
the first gate electrode overlaps the first channel region via an upper gate insulating layer, and the second gate electrode overlaps the second channel region via the upper gate insulating layer.

2. The active matrix substrate according to claim 1, wherein the semiconductor layer further includes an intervening region located between the first channel region and the second channel region when viewed from the normal direction of the substrate, and
the intervening region is located between the first gate electrode and the second gate electrode when viewed from the normal direction of the substrate.

3. The active matrix substrate according to claim 2, wherein the first TFT further includes a lower conductive layer located on the substrate side of the semiconductor layer and at least partially overlapping the first channel region and/or the second channel region of the semiconductor layer via a lower insulating layer.

4. The active matrix substrate according to claim 3, wherein the lower conductive layer overlaps the entirety of a first region including the first channel region, the second channel region, and the intervening region of the semiconductor layer when viewed from the normal direction of the substrate.

5. The active matrix substrate according to claim 3, wherein the lower conductive layer includes a first lower conductive layer at least partially overlapping the first channel region and a second lower conductive layer at least partially overlapping the second channel region when viewed from the normal direction of the substrate, and
at least a part of the intervening region is located between the first lower conductive layer and the second lower conductive layer when viewed from the normal direction of the substrate.

6. The active matrix substrate according to claim 2, wherein the intervening region is a low-resistive region having a lower specific resistance than the first channel region and the second channel region.

7. The active matrix substrate according to claim 1, further comprising:
a wiring line disposed on a side of the semiconductor layer opposite to the substrate,
wherein the wiring line includes two portions extending across the semiconductor layer in a channel width direction when viewed from the normal direction of the substrate, each of the two portions functioning as respective one of the first gate electrode and the second gate electrode.

8. The active matrix substrate according to claim 1,
wherein the semiconductor layer includes a high-mobility semiconductor having a mobility of 20 cm$^2$/Vs or greater.

9. The active matrix substrate according to claim 1,
wherein the second TFT includes a second semiconductor layer including a single channel region and a single gate electrode disposed on a side of the second semiconductor layer opposite to the substrate.

10. The active matrix substrate according to claim 1,
wherein the clock signal is configured to intermittently perform a clock operation, in which a potential periodically changes between a low-level potential and a high-level potential, with a clock stop period, in which the clock operation is stopped, interposed in the clock operation.

11. The active matrix substrate according to claim 10,
wherein a negative bias is applied to the first gate electrode and the second gate electrode of the first TFT in the clock stop period.

12. The active matrix substrate according to claim 10,
wherein each of the plurality of unit circuits further receives a control signal and a reset signal, the control signal being a signal turned to a low-level potential in a period other than the clock stop period and turned to a high-level potential in the clock stop period, and the reset signal being a clear signal or a signal output from a unit circuit of a stage subsequent to each of the plurality of unit circuits, and
each of the plurality of unit circuits further includes a third TFT including a third gate terminal supplied with the reset signal, a third source terminal supplied with the control signal, and a third drain terminal connected to the first node.

13. A display device comprising:
the active matrix substrate according to claim 10;
a counter substrate facing the active matrix substrate;
a liquid crystal layer provided between the active matrix substrate and the counter substrate; and
a touch sensor,
wherein the display device is configured to detect a touch position by the touch sensor during the clock stop period.

14. The active matrix substrate according to claim 1,
wherein each of the plurality of unit circuits further includes a capacitance portion including a first electrode connected to the output node and a second electrode connected to the first node.

15. The active matrix substrate according to claim 1, further comprising
a controller configured to supply a plurality of signals including the clock signal and the start pulse signal to the shift register.

16. The active matrix substrate according to claim 1,
wherein the first TFT is an oxide semiconductor TFT including an oxide semiconductor layer as an active layer.

17. The active matrix substrate according to claim 16,
wherein the oxide semiconductor layer includes an In—Ga—Zn—O based semiconductor.

18. The active matrix substrate according to claim 17,
wherein the In—Ga—Zn—O based semiconductor includes a crystalline portion.

* * * * *